(12) United States Patent
Watanabe et al.

(10) Patent No.: US 9,472,510 B2
(45) Date of Patent: Oct. 18, 2016

(54) SEMICONDUCTOR DEVICE AND CONTROL SYSTEM

(71) Applicant: Renesas Electronics Corporation, Kawasaki-shi; Kanagawa (JP)

(72) Inventors: Kazuki Watanabe, Kanagawa (JP); Yosuke Tanno, Kanagawa (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 206 days.

(21) Appl. No.: 13/858,178

(22) Filed: Apr. 8, 2013

(65) Prior Publication Data
US 2013/0278284 A1    Oct. 24, 2013

(30) Foreign Application Priority Data

Apr. 20, 2012  (JP) .................. 2012-096466

(51) Int. Cl.
*H01L 23/00*    (2006.01)
*G05F 1/573*    (2006.01)
*G06K 19/07*    (2006.01)

(52) U.S. Cl.
CPC ............. *H01L 23/576* (2013.01); *G05F 1/573* (2013.01); *G06K 19/0715* (2013.01); *H01L 2924/0002* (2013.01)

(58) Field of Classification Search
CPC .................. H03K 18/1776; H03K 19/17732; H03K 19/223; G06F 1/28; G06F 1/30; G06F 1/26; G06F 1/266; G06F 1/3203; G06F 1/24; G06F 1/3237; G06F 1/3287; G06F 1/3243; G06F 1/305; G06F 1/32; G06F 1/573; G06F 19/0715; H01L 23/576; Y02B 60/1278; Y02B 70/16

USPC ........... 326/38-41, 47, 101, 8; 323/282-284, 323/311; 713/330, 340, 300, 320

See application file for complete search history.

(56) References Cited

U.S. PATENT DOCUMENTS 7,847,581 B2    12/2010  Lisart et al.
8,004,362 B2    8/2011   Hirayama
(Continued)

FOREIGN PATENT DOCUMENTS

| JP | 08-255872 A | 10/1996 |
|----|-------------|---------|
| JP | 2005-295360 A | 10/2005 |
| JP | 2006-093311 A | 4/2006 |
| JP | 2009-038186 A | 2/2009 |
| JP | 2009-253297 A | 10/2009 |
| WO | 2008/023487 A1 | 2/2008 |

OTHER PUBLICATIONS

Office Action, issued Oct. 12, 2015, in Chinese Application No. 201310136758.3.
(Continued)

*Primary Examiner* — Vibol Tan
(74) *Attorney, Agent, or Firm* — Shapiro, Gabor and Rosenberger, PLLC

(57) ABSTRACT

To enhance the security of a semiconductor device, the semiconductor device has a regulator unit for generating an internal power supply voltage based on a power supply voltage supplied from outside, an internal circuit which operates on the internal power supply voltage, a current detection unit for monitoring a power supply current supplied to the internal circuit, and a control unit for controlling operation of the internal circuit. In the semiconductor device, when the current detection unit detects that the power supply current exceeds a predetermined threshold value, the control unit restricts the operation of the internal circuit.

18 Claims, 19 Drawing Sheets

(56) References Cited

U.S. PATENT DOCUMENTS

| | | |
|---|---|---|
| 2007/0091527 A1 | 4/2007 | Julicher |
| 2008/0197829 A1 | 8/2008 | Nagata et al. |
| 2011/0148383 A1* | 6/2011 | Mullen et al. ............... 323/299 |
| 2011/0156674 A1* | 6/2011 | Lin et al. ..................... 323/282 |
| 2011/0291630 A1* | 12/2011 | Konstadinidis et al. ..... 323/283 |
| 2012/0242312 A1* | 9/2012 | Heng .......................... 323/282 |

OTHER PUBLICATIONS

Office Action, issued Mar. 17, 2016, in Japanese Patent Application No. 2012-096466.

* cited by examiner

SEMICONDUCTOR DEVICE AND CONTROL SYSTEM

CROSS-REFERENCE TO RELATED APPLICATIONS

The disclosure of Japanese Patent Application No. 2012-096466 filed on Apr. 20, 2012 including the specification, drawings and abstract is incorporated herein by reference in its entirety.

BACKGROUND

The present invention relates to a semiconductor device and a control system, and particularly to a technique effectively applied to a semiconductor device that is required to have high security.

Devices such as cellular phones, IC cards, automobiles, and industrial machines incorporate microcontrollers. The microcontrollers are semiconductor devices that control the respective devices by performing processing in accordance with programs stored in memories. The microcontrollers are required to have security according to uses. For example, a microcontroller incorporated in an IC card having the function of encrypting and authenticating information is required to have high security in order to prevent the fraudulent use and falsification of data, malfunction, and the like. For example, the microcontroller that is incorporated in the IC card etc. and required to have high security (hereinafter also referred to as a "secure microcontroller") is required not to malfunction even if attacks to draw security information are performed through various techniques, which is vital to the product. One of such attack techniques is, for example, a laser attack. By the laser attack, the semiconductor device such as the secure microcontroller is locally irradiated with a laser beam, thereby causing a malfunction of an internal circuit including a CPU, a memory, and the like.

For example, Japanese Unexamined Patent Publication No. 2009-253297 (Patent Document 1) discloses a related art for a measure against the laser attack. According to the technique disclosed in Patent Document 1, a protection shield comprised of a doped region (N-well) is provided deep inside a semiconductor substrate so as to form a current path upon laser irradiation, and a current in the current path is detected, thereby detecting the laser attack.

In addition, for example Japanese Unexamined Patent Publication No. 2009-38186 (Patent Document 2) discloses a related art for enhancing the security of the semiconductor device. According to the technique disclosed in Patent Document 2, the operating power supply voltage of an internal circuit is separated from the power supply voltage of an N-well where the internal circuit is formed, and a detection circuit detects an increase in current flowing into the N-well at the time of latchup, thereby detecting the latchup.

SUMMARY

The present inventors have newly found a problem of latchup caused by irradiating the semiconductor device with a laser in the microfabrication process of the semiconductor device. An occurrence of latchup might cause a malfunction of the internal circuit of an IC chip or destruction of the IC chip. In particular, the secure microcontroller is required not to malfunction even at the time of occurrence of latchup.

According to the technique of Patent Document 1, due to a laser irradiation-based current increase, the current path of an abnormal current is limited. That is, abnormal currents that flow without passing through the protection shield cannot be detected; therefore, it is not possible to meet various current paths as in latchup. Further, the provision of the protection shield inside the substrate brings about separation between a power supply voltage for a substrate potential and a power supply voltage for circuit operation, which requires double wiring for the power supply voltages and increases a chip area.

The technique of Patent Document 2 is a technique for avoiding the latchup that occurs due to the potential relationship between a diffusion layer and each well of the internal circuit caused by the process of the semiconductor device; therefore, there is a high possibility that it is not possible to detect latchup that occurs local-y by laser irradiation or the like. To detect the latchup that occurs locally, there may be a method of disposing a number of detection circuits for the respective N-wells in the semiconductor chip; however, this method increases a chip area and is therefore not an appropriate method.

In recent years, the semiconductor device including the secure microcontroller has been required to have higher security; accordingly, the present inventors have thought that there is a need for a technique for enhancing security so that the semiconductor device does not malfunction when it falls into an abnormal state including latchup.

While means for solving these problems will be described below, the other problems and novel features will become apparent from the description of this specification and the accompanying drawings.

A typical one of the embodiments disclosed in the present application will be briefly described as follows.

A semiconductor device has a regulator unit for generating an internal power supply voltage based on a power supply voltage supplied from outside, an internal circuit which operates on the internal power supply voltage, a current detection unit for monitoring a power supply current supplied to the internal circuit, and a control unit for controlling operation of the internal circuit. In the semiconductor device, if the current detection unit detects that the power supply current exceeds a predetermined threshold value, the control unit restricts the operation of the internal circuit.

An effect obtained by the typical one of the embodiments disclosed in the present application will be briefly described as follows.

It is possible to enhance the security of the semiconductor device.

DETAILED DESCRIPTION

1. Outline of Embodiments

Figure 1:
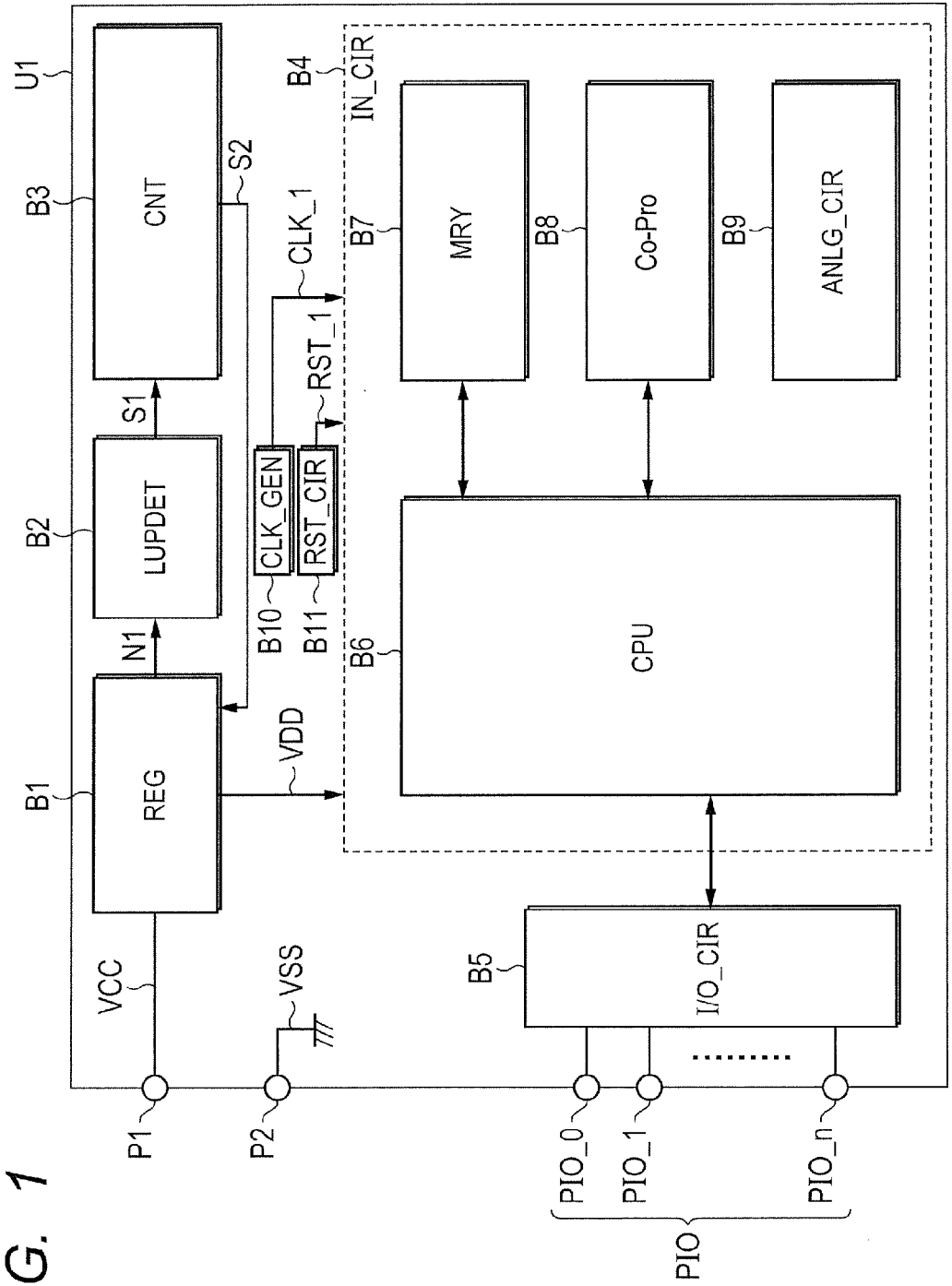
FIG. 1 is a block diagram illustrating the basic configuration of a semiconductor device for a contact IC card, according to a first embodiment.

First, exemplary embodiments of the invention disclosed in the present application will be outlined. Reference numerals in the drawings that refer to with parentheses applied thereto in the outline description of the exemplary embodiments are merely illustration of ones contained in the concepts of components marked with the reference numerals.

[1] Semiconductor Device that Detects Abnormal Current in Internal Circuit and Controls Operation of Internal Circuit A semiconductor device (U1 to U6) according to an exemplary embodiment of the present application has a regulator unit (B1) for generating an internal power supply voltage (VDD) based on a power supply voltage (VCC) supplied from outside, an internal circuit (B4) which operates on the internal power supply voltage, a current detection unit (B2) for monitoring a power supply current supplied to the internal circuit, and a control unit (B3) for controlling operation of the internal circuit. The internal circuit includes a data processing unit (B6, B7, B8) for executing a program. If the current detection unit detects that the power supply current exceeds a predetermined threshold value, the current detection unit outputs a detection result indicating that. The control unit restricts the operation of the internal circuit in accordance with the detection result.

An occurrence of an abnormality in the internal circuit often causes a sudden increase in the power supply current supplied to the internal circuit. For example, an occurrence of latchup in some region in the internal circuit generates a very large current flow, leading to a sudden increase in the power supply current of the internal circuit. In addition, there is a possibility of an increase in the power supply current of the internal circuit due to the flow of a short-circuit current or the like caused by changing the coupling between circuits in the semiconductor device by FIB (Focused Ion Beam) milling or the like for the purpose of fraudulently acquiring and falsifying data. Since the semiconductor device according to item 1 monitors the power supply current supplied to the internal circuit, it is possible to detect the occurrence of an abnormality such as latchup in the internal circuit. Further, since the operation of the internal circuit is restricted upon detection of excess of the power supply current over the predetermined threshold value, it is possible to prevent the malfunction of the internal circuit.

[2] Detection MOS

In the semiconductor device according to item 1, the regulator unit has a first MOS transistor (M1) for supplying the internal power supply voltage to the internal circuit and an amplifier unit (B12) for adjusting a gate voltage of the first MOS transistor so that the internal power supply voltage is maintained constant. Further, the current detection unit has a second MOS transistor (M2) whose gate voltage is equal to the gate voltage of the first MOS transistor and a determination unit (I1, A2[R3, A3]) for determining whether or not the power supply current exceeds the predetermined threshold value based on a current flowing through the second MOS transistor.

According to this, it is possible to easily detect a change in the power supply current supplied to the internal circuit. Particularly, this is effectively applied to a regulator part of a microcontroller, such as incorporated in a contact IC card, to which a stable external power supply voltage is supplied. Further, a detecting circuit is not inserted in a current path leading from the first MOS transistor M1 to the internal circuit, which makes it possible to meet an application with a low power supply voltage as well.

[3] Stop Internal Circuit: Stop Regulator

In the semiconductor device (U1, U4, U5) according to item 1 or 2, the control unit restricts the operation of the internal circuit by stopping power supply to the internal circuit.

According to this, current supply to the internal circuit is stopped, which makes it possible to prevent the malfunction of the internal circuit. Further, according to this, it is possible to quickly get out of a state where an abnormal current continues to flow through the internal circuit, and therefore prevent circuit elements and wiring configuring the internal circuit etc. from deteriorating due to heat etc. generated by the abnormal current.

Figure 5:
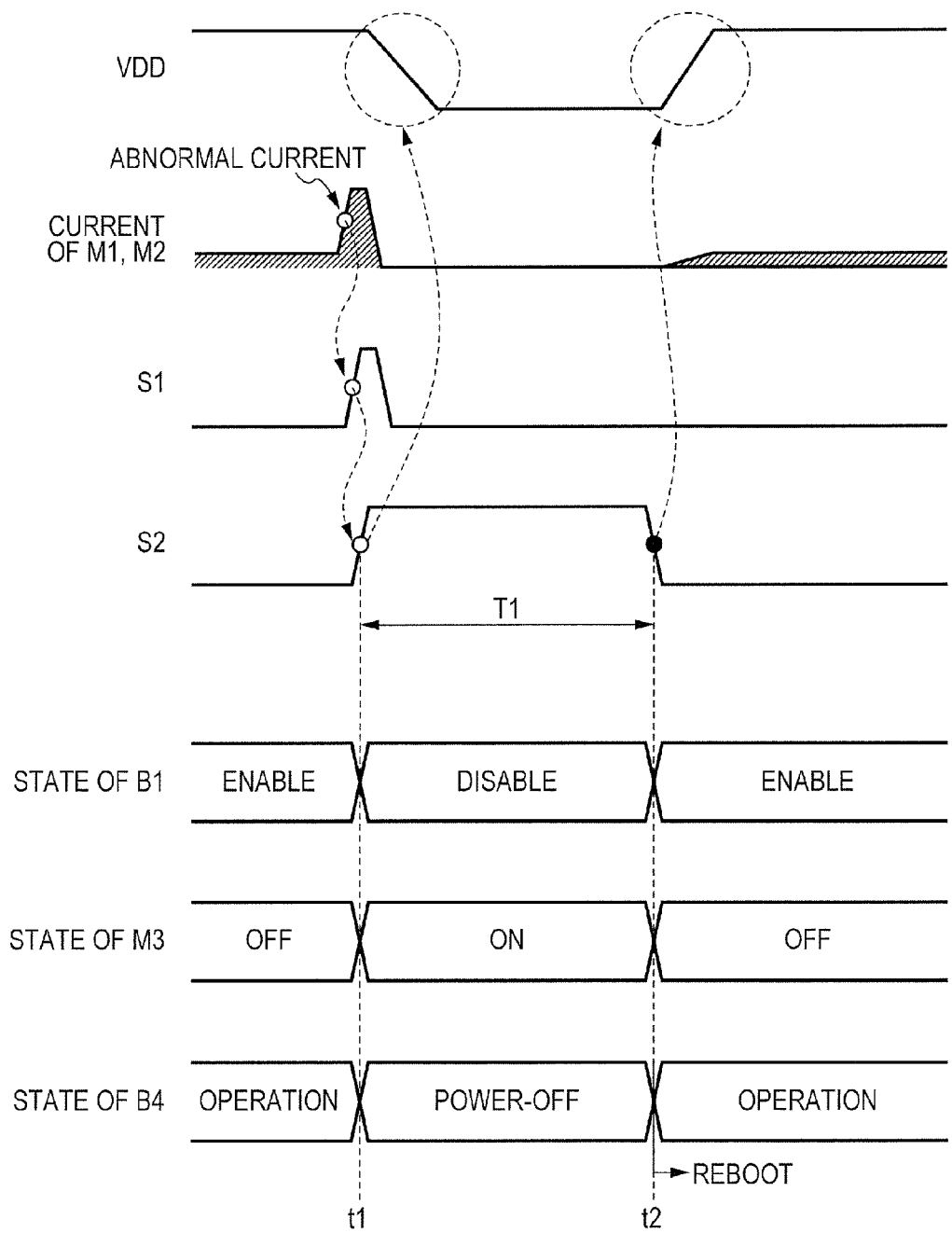
FIG. 5 is an explanation diagram showing an operation example of the semiconductor device U1 at the time of detection of an abnormal current.

[4] Stop Internal Circuit: Stop Regulator for Only Predetermined Time: FIG. 5

In the semiconductor device according to item 3, the control unit stops the power supply to the internal circuit by stopping operation of the regulator unit for a predetermined time (T1).

According to this, even though the power supply to the internal circuit is stopped due to the flow of the abnormal current, the power supply is resumed after the lapse of the predetermined time, which facilitates power management system design.

[5] Adjust Current Detection Level in accordance with Register for Setting Threshold Value The semiconductor device (U5) according to any one of items 1 to 4 further has a register unit which can be accessed by the data processing unit and in which control information is set. In the semiconductor device, the determination unit changes the predetermined threshold value in accordance with the control information set in the register unit.

According to this, it is possible to easily adjust the detection level of the abnormal current which occurs in the internal circuit. For example, it is possible to dynamically adjust the detection level of the abnormal current in accordance with the operation mode of the internal circuit.

[6] Adjust Current Detection Level in accordance with Operation Clock Frequency

In the semiconductor device according to item 5, the data processing unit changes the control information in accordance with an operation clock frequency of the internal circuit.

According to this, even though a consumption current varies with the change of the operation clock frequency of the internal circuit, it is possible to suppress variation in the detection sensitivity of the abnormal current.

[7] Adjust Current Detection Level in accordance with Presence or Absence of Operation of Coprocessor In the semiconductor device according to item 5 or 6, the data processing unit includes a central processing unit (B6), a storage unit (B7), and a signal processing unit (B8) for executing signal processing in accordance with an instruction from the central processing unit. The central processing unit changes the control information in accordance with presence or absence of execution of signal processing by the signal processing unit.

According to this, even though the consumption current of the internal circuit varies depending on the presence or absence of execution of signal processing by the signal processing unit, it is possible to suppress variation in the detection sensitivity of the abnormal current.

[8] Stop Internal Circuit: Stop Supply of Clock Signal

In the semiconductor device (U2) according to any one of items 1 to 7, the control unit restricts the operation of the internal circuit by stopping supply of an operation clock signal (CLK_2) to the internal circuit.

According to this, when the abnormal current flows through the internal circuit, it is possible to cause the internal circuit to transition to a stopped state; therefore, it is possible to easily prevent the malfunction of the internal circuit.

[9] Stop Internal Circuit: Reset

In the semiconductor device (U3) according to any one of items 1 to 8, the control unit restricts the operation of the internal circuit by resetting the internal circuit.

According to this, when the abnormal current flows through the internal circuit, it is possible to cause the internal, circuit to transition to the stopped state; therefore, it is possible to easily prevent the malfunction of the internal circuit.

[10] Notification of Error

The semiconductor device according to any one of items 1 to 9 further has a communication terminal (PIO) for transmitting and receiving a signal. In the semiconductor device, the control unit outputs an error signal (S4) indicating occurrence of an abnormality to the communication terminal in accordance with the detection result.

According to this, it is possible to notify the occurrence of an abnormality in the internal circuit to the outside.

[11] Stop Internal Circuit: Stop Communication with Outside

In the semiconductor device (U6) according to item 10, the control unit restricts the operation of the internal circuit by shutting off communication through the communication terminal by the internal circuit.

According to this, when the internal circuit is in an abnormal state, it is possible to stop data transmission/reception between an external device and the internal circuit; therefore, it is possible to prevent the fraudulent acquisition and falsification of data in the abnormal state.

Figure 4:
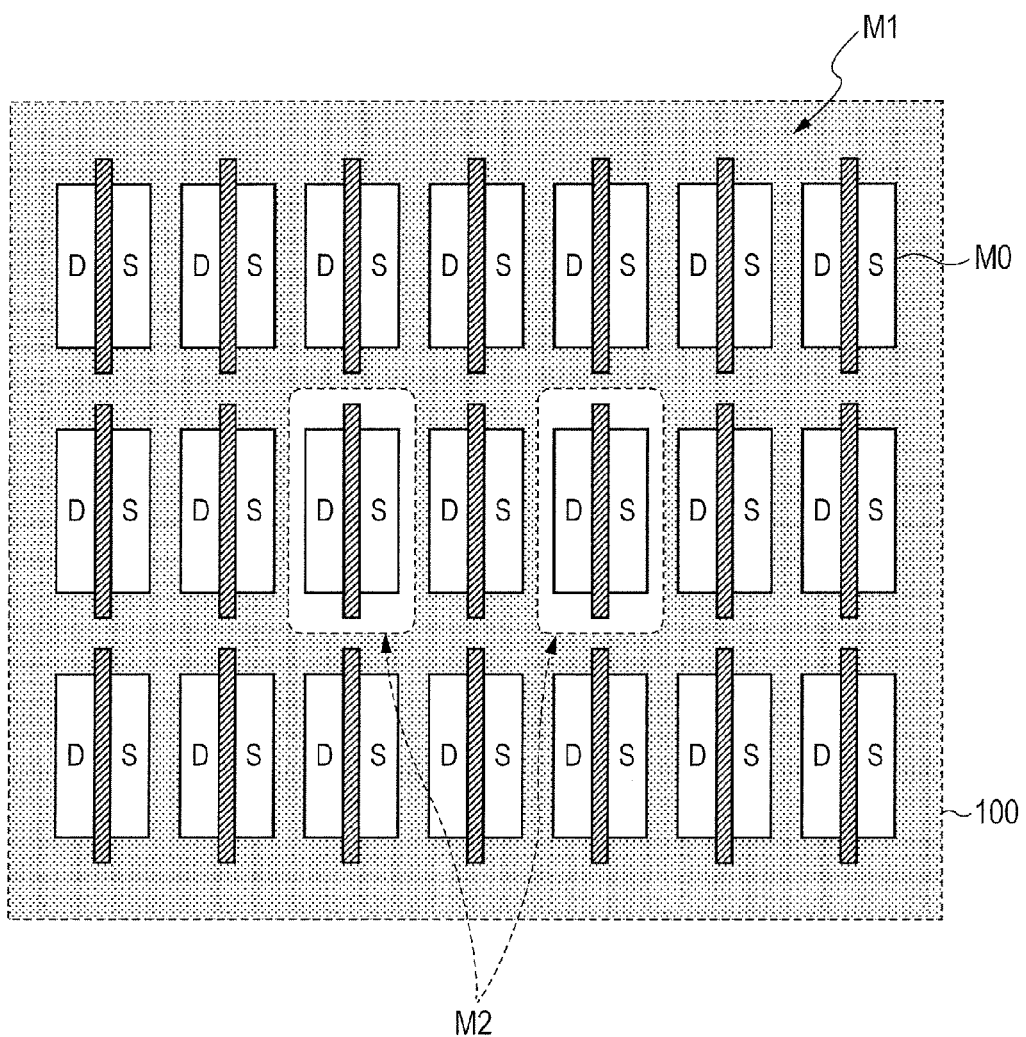
FIG. 4 is an explanation diagram illustrating the layout arrangement of PMOS transistors M1 and M2.

[12] Detection MOS<Output Stage MOS: FIG. 4

In the semiconductor device according to any one of items 2 to 11, the second MOS transistor has s smaller current capability than the first MOS transistor.

According to this, it is possible to monitor the presence or absence of the abnormal current, using a smaller current than the abnormal current flowing through the internal circuit.

[13] Unit MOS Transistor: FIG. 4

In the semiconductor device according to item 2 or 12, the first MOS transistor and the second MOS transistor include unit MOS transistors (M0) having predetermined gate length and gate width. Further, the number of unit MOS transistors configuring the second MOS transistor is smaller than the number of unit MOS transistors configuring the first MOS transistor.

According to this, compared to forming the first MOS transistor and the second MOS transistor separately with the gate length and gate width changed, it is possible to reduce a deviation in the size ratio between the first MOS transistor and the second MOS transistor, and therefore suppress deterioration of current detection accuracy.

[14] Form Output Stage MOS and Detection MOS in Same Element Formation Region: FIG. 4

In the semiconductor device according to item 13, the unit MOS transistors configuring the first MOS transistor and the unit MOS transistors configuring the second MOS transistor are formed in the same element formation region (100) so that drains and sources are arranged in the same direction with respect to gates of the respective unit MOS transistors.

According to this, it is possible to further reduce the relative error of the first MOS transistor and the second MOS transistor and further suppress the deterioration of current detection accuracy.

[15] Arrange Detection MOS Dispersedly: FIG. 4

In the semiconductor device according to item 14, the unit MOS transistors configuring the second MOS transistor are arranged dispersedly in the element formation region.

According to this, compared to the case where the second MOS transistor is arranged intensively at a predetermined location in the element formation region, it is possible to reduce the relative error of the first MOS transistor and the second MOS transistor caused by a transistor characteristic deviation associated with arrangement in the element formation region, and further suppress the deterioration of current detection accuracy.

[16] Current Detection Unit: Current Comparison

In the semiconductor device according to any one of items 2 to 15, the determination unit has a current source (I1, Ix) which is coupled to a drain of the second MOS transistor and generates a reference current corresponding to the predetermined threshold value and a comparison circuit (A2) for comparing magnitudes of the current flowing through the second MOS transistor and the reference current based on a voltage of a node between the current source and the second MOS transistor. The comparison circuit outputs the detection result when the current flowing through the second MOS transistor is larger than the reference current.

According to this, it is possible to detect the abnormal current with a simple circuit configuration.

[17] Current Detection Unit: Voltage Comparison

In the semiconductor device according to any one of items 2 to 15, the determination unit has a resistive element (R3)

for converting the current flowing through the second MOS transistor into a voltage, and a comparison circuit (A3) for comparing the voltage converted by the resistive element with a reference voltage corresponding to the predetermined threshold value. The comparison circuit outputs the detection result when the converted voltage is larger.

According to this, it is possible to detect the abnormal current more accurately.

[18] Control System: Stop Power Supply upon Detection of Error

A control system (U30) according to an exemplary embodiment of the present application includes the semiconductor device (U1 to U6) according to any one of items 10 to 17 and a control device (U21) which controls supply of a power supply voltage to the semiconductor device and transmits and receives a signal to/from the semiconductor device. When the error signal is outputted, the control device stops power supply to the semiconductor device that has outputted the error signal.

According to this, when the abnormal current flows through the internal circuit, the control device stops the power supply not only to the internal circuit but to the whole of the semiconductor device; therefore, it is possible to avoid the state where the abnormal current continues to flow through the semiconductor device and cause the whole system to transition to a safer state.

[19] Control System: Switch to Semiconductor Device for Backup upon Detection of Error The control system according to item 18 has a plurality of the semiconductor devices. The semiconductor devices include a first semiconductor device (U1A) which operates as a main terminal and one or a plurality of second semiconductor devices (U1B) which operate as sub-terminals. If the error signal is outputted from the first semiconductor device, the control device operates one of the second semiconductor devices as the main terminal.

According to this, it is possible to continue processing without stopping the system when the first semiconductor device as the main terminal falls into the abnormal state.

[20] Host Device: Semiconductor Device is Detachable

The control system according to item 18 or 19 further has sockets (U23, U24) in which the semiconductor devices are mounted and electrically couple the semiconductor devices to the control device. The semiconductor devices are detachably coupled to the sockets.

According to this, it becomes easy to discontinue the use of the semiconductor device through which the abnormal current has once flowed and replace it with another semiconductor device, which is particularly effective in terms of maintaining the system in the safe state.

2. Details of Embodiments

Embodiments will be described in greater detail below.

First Embodiment

FIG. 1 is a block diagram illustrating the basic configuration of a semiconductor device for a contact IC card, according to this embodiment. The semiconductor device U1 shown in FIG. 1 is, for example, a secure microcontroller. Although not restricted, the semiconductor device U1 is formed over a single semiconductor substrate made of, e.g., monocrystalline silicon, using a known semiconductor integrated circuit manufacturing technology. The semiconductor device U1 has the function of detecting that an abnormal current has flowed into an internal circuit and restricting the operation of the internal circuit.

The semiconductor device U1 has a regulator circuit (REG) B1, a current detection circuit (LUPDET) B2, a control circuit (CNT) B3, an internal circuit (IN_CIR) B4, an I/O circuit (I/O_CIR) B5, a clock generation unit (CLK_GEN) B10, and a reset circuit (RST_CIR) B11. The semiconductor device U1 also has a power supply terminal P1 to which a power supply voltage VCC (reference symbol VCC denotes not only an external power supply voltage but also a power supply line coupled to the power supply terminal P1) is supplied, a ground terminal P2 to which a ground voltage is supplied, and signal input/output terminals PIO_0 to PIO_n (n is a positive integer). Further, the signal input/output terminals PIO_0 to PIO_n are also generically called a signal input/output terminal PIO.

Figure 2:
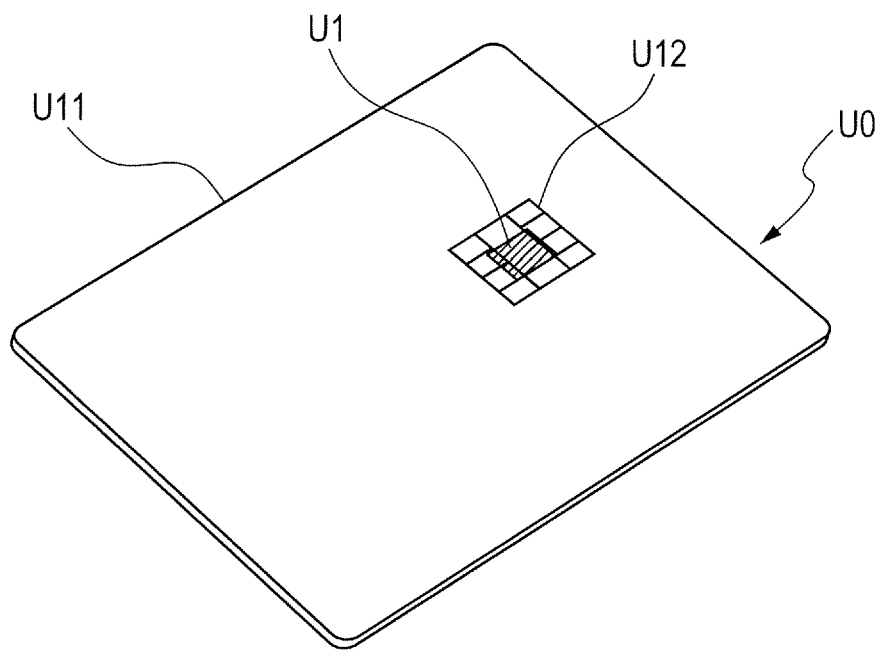
FIG. 2 is an explanation diagram illustrating the structure of an IC card U0 incorporating the semiconductor device U1.

FIG. 2 illustrates the structure of an IC card U0 incorporating the semiconductor device U1. The IC card U0 is formed into a card shape by a resin-molded printed circuit board U11, and incorporates the semiconductor device U1. External contact terminals (the power supply terminal P1, the ground terminal P2, and the signal input/output terminal PIO) of the semiconductor device U1 are configured with a plurality of metal terminals U12 separately formed on the surface of the IC card U0.

In FIG. 1, the internal circuit B4 operates on power supplied from an internal power supply line VDD (reference symbol VDD denotes not only a power supply line but also an internal power supply voltage supplied to the power supply line). The internal circuit B4 is configured with a central processing unit (CPU) B6, a memory (MRY) B7, a coprocessor (Co-Pro) B8, and an analog circuit (ANLG-_CIR) B9. The central processing unit B6 transmits and receives information signals to/from an external device through the I/O circuit B5 and the signal input/output terminal PIO, and also executes an arithmetic operation according to an instruction from the external device. At this time, the memory B7 is used to store information data, transmission data, and the like, and the coprocessor B8 is used to execute a special arithmetic operation. The coprocessor B8 is, e.g., a dedicated arithmetic processing circuit for performing a cryptographic arithmetic operation, and executes arithmetic processing in accordance with an instruction from the central processing unit B6. The analog circuit B9 generates signals, such as a clock signal, necessary for the operation of other circuits.

The clock generation unit B10 generates various clock signals. For example, at least one of the generated clock signals is supplied as an operation clock signal CLK_1 to the internal circuit B4. The operating power supply voltage of the clock generation unit B10 may be the external power supply voltage VCC or the internal power supply voltage VDD. The reset circuit B11 generates a reset signal RST_1 supplied to the internal circuit B4. For example, based on a power-on reset signal and various reset signals, the reset circuit B11 generates the reset signal RST_1. The reset circuit B11 operates on the external power supply voltage VCC.

Figure 3:
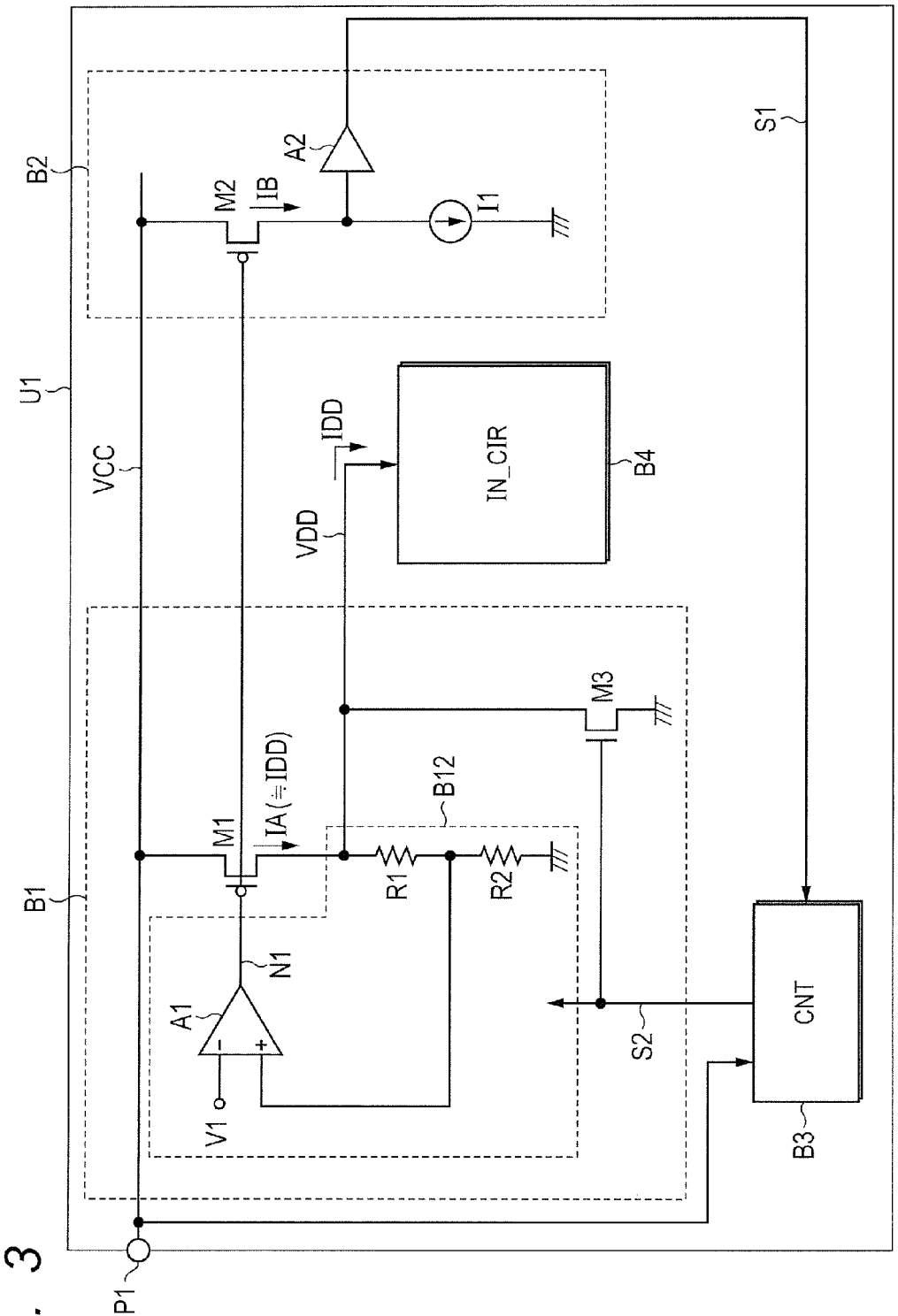
FIG. 3 is a block diagram illustrating the detailed internal configuration of the semiconductor device U1.

FIG. 3 is a block diagram illustrating the detailed internal configuration of the semiconductor device U1. For clarification, FIG. 3 shows the regulator circuit B1, the current detection circuit B2, the internal circuit B4, the control circuit B3, and the power supply terminal P1 in the semiconductor device U1.

In FIG. 3, the regulator circuit B1 generates the internal power supply voltage by controlling the voltage supplied from the power supply terminal P1 to the power supply line VCC to the predetermined voltage value. The regulator circuit B1 is configured with, e.g., a P-channel MOS transistor (hereinafter also simply referred to as a PMOS transistor) M1 and a power supply control circuit B12. The PMOS transistor M1 is coupled between the power supply terminal P1 and the internal power supply line VDD, and receives a control signal N1 generated by the voltage control circuit B12 at its gate terminal.

The voltage control circuit B12 is configured as follows. A voltage dividing resistor R1 and a voltage dividing resistor R2 are provided between the internal power supply line VDD and a ground line VSS. A divided voltage obtained at the coupling point between the voltage dividing resistors R1 and R2 is supplied to a non-inverting input terminal (+) of an operational amplifier circuit A1. A reference voltage source V1 is coupled between an inverting input terminal (−) of the operational amplifier circuit A1 and the ground line VSS. The operating power supply voltage of the voltage control circuit B12 is the external power supply voltage VCC supplied from the power supply voltage terminal P1. With the above configuration, the voltage control circuit B12 generates a voltage proportional to the difference between the divided voltage obtained at the coupling point between the voltage dividing resistors R1 and R2 and the output voltage of the reference voltage source V1, and outputs this voltage as the control signal N1. The gate voltage of the PMOS transistor M1 is controlled so that the divided voltage at the point between the resistors R1 and R2 becomes equal to the reference voltage V1, for regulator operation. This controls a current flowing through the PMOS transistor M1 and maintains the voltage supplied to the internal power supply line VDD at the predetermined voltage value. The generated internal power supply voltage VDD is the operating power supply voltage of the internal circuit B4, as described above.

The current detection circuit B2 monitors a power supply current supplied to the internal circuit B4. Upon detection of the flow of an abnormal current exceeding the consumption current of the internal circuit B4 during a normal operation, the current detection circuit B2 outputs the detection result.

More specifically, the current detection circuit B2 includes a PMOS transistor M2, a current source I1, and a binarization circuit A2. The PMOS transistor M2 receives the control signal N1 outputted from the voltage control circuit B12 at its gate terminal, and receives the power supply voltage VDD at its source terminal. Thereby, the gate-source voltages of the PMOS transistors M1 and M2 are made equal, and a drain current IB proportional to a drain current IA of the PMOS transistor M1 flows through the PMOS transistor M2. The details of the PMOS transistors M1 and M2 will be described later.

The current source I1 generates a reference current I1 (reference symbol 11 denotes not only the current source but also the reference current) for determining whether or not an abnormal current flows through the internal circuit B4. The binarization circuit A2 binarizes the result of comparing the magnitudes of the drain current IB of the PMOS transistor M2 and the reference current I1, and outputs a detection signal S1. For example, the binarization circuit A2 outputs a signal of a high level (VCC) if the drain current IB is larger than the reference current I1, and outputs a signal of a low level (VSS) if the drain current IB is smaller than the reference current I1. A current detection level which is a threshold value for determining whether or not the abnormal current flows is determined based on the element size ratio between the PMOS transistors M1 and M2 and the reference current I1. For example, in the case where the size ratio (W/L) of the PMOS transistor M2 is 1/N that of the PMOS transistor M1, when the drain current IA of the PMOS transistor M1 becomes N times larger than the reference current I1, the signal level of the detection signal S1 switches to the high level. That is, the current detection level is "N×I1". Further, while the drain current IA of the PMOS transistor M1 is the sum of a current flowing through the voltage dividing resistors R1 and R2 and the power supply current (circuit current) IDD of the internal circuit B4, if the power supply current IDD of the internal circuit B4 is sufficiently larger than the current flowing through the voltage dividing resistors R1 and R2, IA can be assumed to be approximately IDD. Accordingly, the current detection level "N×I1" is set to be larger than the consumption current of the internal circuit B4 during the normal operation. This makes it possible to determine that the abnormal current larger than the consumption current during the normal operation flows through the internal circuit B4 when the detection signal S1 from the current detection circuit B2 becomes the high level.

FIG. 4 illustrates the layout arrangement of the PMOS transistors M1 and M2, by way of example in which the size ratio between the PMOS transistors M1 and M2 is 19:2.

As shown in FIG. 4, desirably the PMOS transistors M1 and M2 are configured with unit MOS transistors M0 having predetermined gate length and gate width and the size ratio between the PMOS transistors M1 and M2 is adjusted by the number of unit MOS transistors M0. With this, compared to forming the PMOS transistors M1 and M2 separately with the transistor gate width and gate length changed, it is possible to reduce the difference between MOS transistor characteristics and reduce a deviation in the size ratio between the PMOS transistors M1 and M2. This can suppress deterioration of current detection accuracy.

Further, it is desirable that the PMOS transistors M1 and M2 are arranged closely in the same direction. For example, as shown in FIG. 4, the PMOS transistors M1 and M2 are formed in the same element formation region 100 so that the drains and the sources are arranged in the same direction with respect to the gates of the respective unit MOS transistors M0. With this, it is possible to further reduce the relative error of the PMOS transistors M1 and M2 and further suppress the deterioration of current detection accuracy.

Further, in the case where the number of unit MOS transistors M0 configuring the PMOS transistor M2 is significantly smaller than that of the PMOS transistor M1 as shown in FIG. 4, it is desirable that the unit MOS transistors M0 of the PMOS transistor M2 are arranged dispersedly in a transistor region forming the PMOS transistor M1. With this arrangement, compared to the case where the PMOS transistor M2 is arranged intensively at one location in the element formation region 100, it is possible to suppress the relative error of the elements and further suppress the deterioration of current detection accuracy.

With the above configuration of the current detection circuit B2, it is possible to easily detect a change in the power supply current supplied to the internal circuit B4.

Particularly, this is effectively applied to a regulator part of a microcontroller, such as incorporated in the contact IC card, to which a stable external power supply voltage is supplied. Further, according to the current detection circuit B2, a detecting circuit is not inserted in a current path leading from the PMOS transistor M1 to the internal circuit B4, which makes it possible to meet an application with a low power supply voltage as well.

The control circuit B3 is a function unit for controlling the operation of the internal circuit B4. The control circuit B3 operates on the external power supply voltage VCC. More specifically, the control circuit B3 controls the regulator circuit B1 in accordance with the detection signal S1 outputted from the current detection circuit B2, thereby controlling the operation of the internal circuit B4. For example, if the detection signal S1 is at the low level, the control circuit B3 turns a control signal S2 to the low level, thereby controlling the regulator circuit B1 to an enable state for supplying the internal power supply voltage VDD to the internal circuit B4. On the other hand, if the detection signal S1 is at the high level (the abnormal current flows through the internal circuit B4), the control circuit B3 turns the control signal S2 to the high level, thereby controlling the regulator circuit B1 to a disable state for stopping the supply of the internal power supply voltage VDD to the internal circuit B4. The transition of the regulator circuit B1 to the disable state is implemented, for example, by stopping the operation of the operational amplifier circuit A1 in accordance with the control signal S2 and turning the control signal N1 to the VCC level to turn off the PMOS transistor M1.

The internal power supply line VDD has a stabilizing capacitance and a parasitic capacitance (not shown) which supply current to the internal circuit B4 even after the regulator circuit B1 transitions to the disable state as described above. For this reason, an N-type MOS transistor (hereinafter also simply referred to as an NMOS transistor) M3 is provided between the power supply line VDD and the ground line VSS. When the control signal S2 becomes the high level, the NMOS transistor M3 is turned on so that the stabilizing capacitance and the parasitic capacitance are discharged. This makes it possible to stop the current supply to the internal circuit B4 more quickly. In the case of a short discharge time of the internal power supply line VDD e.g. by relatively low resistance values of the voltage dividing resistors R1 and R2 for discharging the stabilizing capacitance etc., the NMOS transistor M3 may be deleted.

Further, the control circuit B3 maintains the control signal S2 at the high level for only a predetermined time T1 after the detection signal S1 from the current detection circuit B2 becomes the high level. The predetermined time T1 is a sufficient time to discharge the internal power supply line VDD. The predetermined time T1 is measured by e.g. a timer circuit provided in the control circuit B3. The timer circuit may be a delay circuit utilizing a CR time constant or a circuit using a counter.

FIG. 5 shows an operation example of the semiconductor device U1 at the time of detection of the abnormal current, by way of example in which the regulator circuit B1 is suspended upon detection of the abnormal current and automatically rebooted after a lapse of the predetermined time T1.

As shown in FIG. 5, when the abnormal current flows through the PMOS transistor M1 at timing t1, the current detection circuit B2 detects it, and the control signal S1 becomes the high level ("1"). Thereby, the control circuit B3 turns the control signal S2 to the high level ("1"). By this control signal S2, the regulator circuit B1 is disabled, and the MOS transistor M3 is turned on, so that the internal power supply voltage VDD is discharged and becomes 0 V. Then, at timing t2 after the lapse of the predetermined time T1, the control circuit B3 returns the control signal S2 to the low level ("0"), and the regulator circuit B1 is enabled again. Thereby, the internal power supply voltage VDD is generated, and power supply to the internal circuit B4 is resumed. By the above control, the time when the abnormal current flows through the PMOS transistor M1 can be suppressed to an extremely short time from when the current detection circuit B2 detects the abnormal current to when the internal power supply line VDD is discharged. This can prevent circuit elements, wiring, and the like configuring the internal circuit B4 etc. from deteriorating due to heat etc. generated by the abnormal current. Further, even though the power supply to the internal circuit is stopped due to the flow of the abnormal current, the power supply is resumed after the lapse of the predetermined time T1, which facilitates power management system design.

Thus, according to the semiconductor device of the first embodiment, it is possible to detect the occurrence of an abnormality in the internal circuit. For example, it is possible to detect an abnormal state such as the flow of the abnormal current generated by latchup in the internal circuit and the flow of a short-circuit current or the like caused by changing the coupling between circuits in the semiconductor device by FIB milling or the like for the purpose of fraudulently acquiring and falsifying data. Further, since the operation of the internal circuit is restricted upon detection of the abnormal current, it is possible to prevent the malfunction of the internal circuit. Further, with the simple circuit configuration of the current detection circuit B2 as described above, it is possible to suppress a circuit size increase with the addition of abnormal current detection.

Second Embodiment

Figure 6:
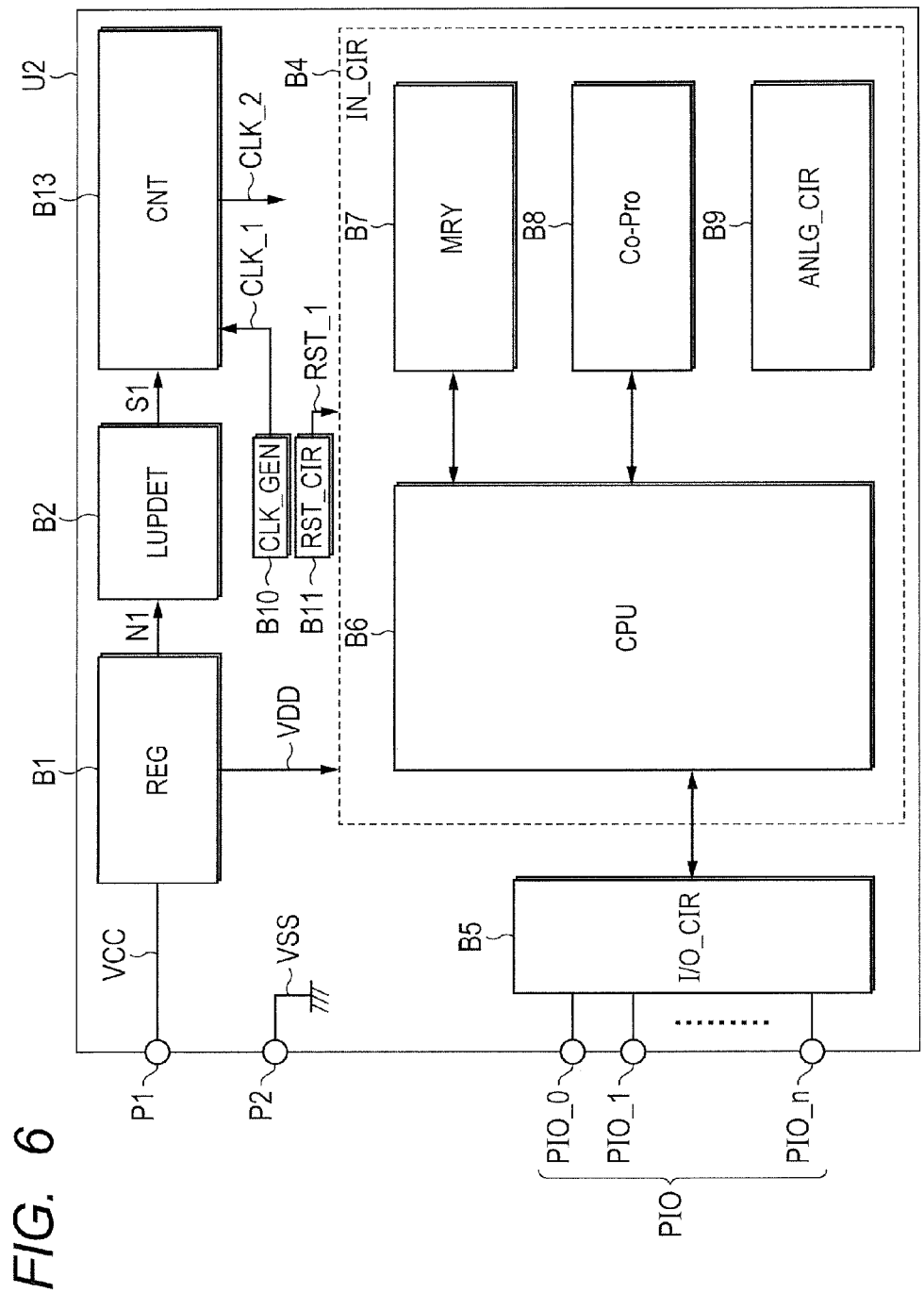
FIG. 6 is a block diagram illustrating the basic configuration of a semiconductor device for the contact IC card, according to a second embodiment.

FIG. 6 is a block diagram illustrating the basic configuration of a semiconductor device for the contact IC card, according to the second embodiment. The semiconductor device U2 shown in FIG. 6 stops the supply of an operation clock signal CLK_2 to the internal circuit B4 upon detection of the abnormal current in the internal circuit B4. In FIG. 6, the same components as those of the semiconductor device U1 according to the first embodiment are denoted by the same reference numerals, and detailed description thereof is omitted.

Figure 7:
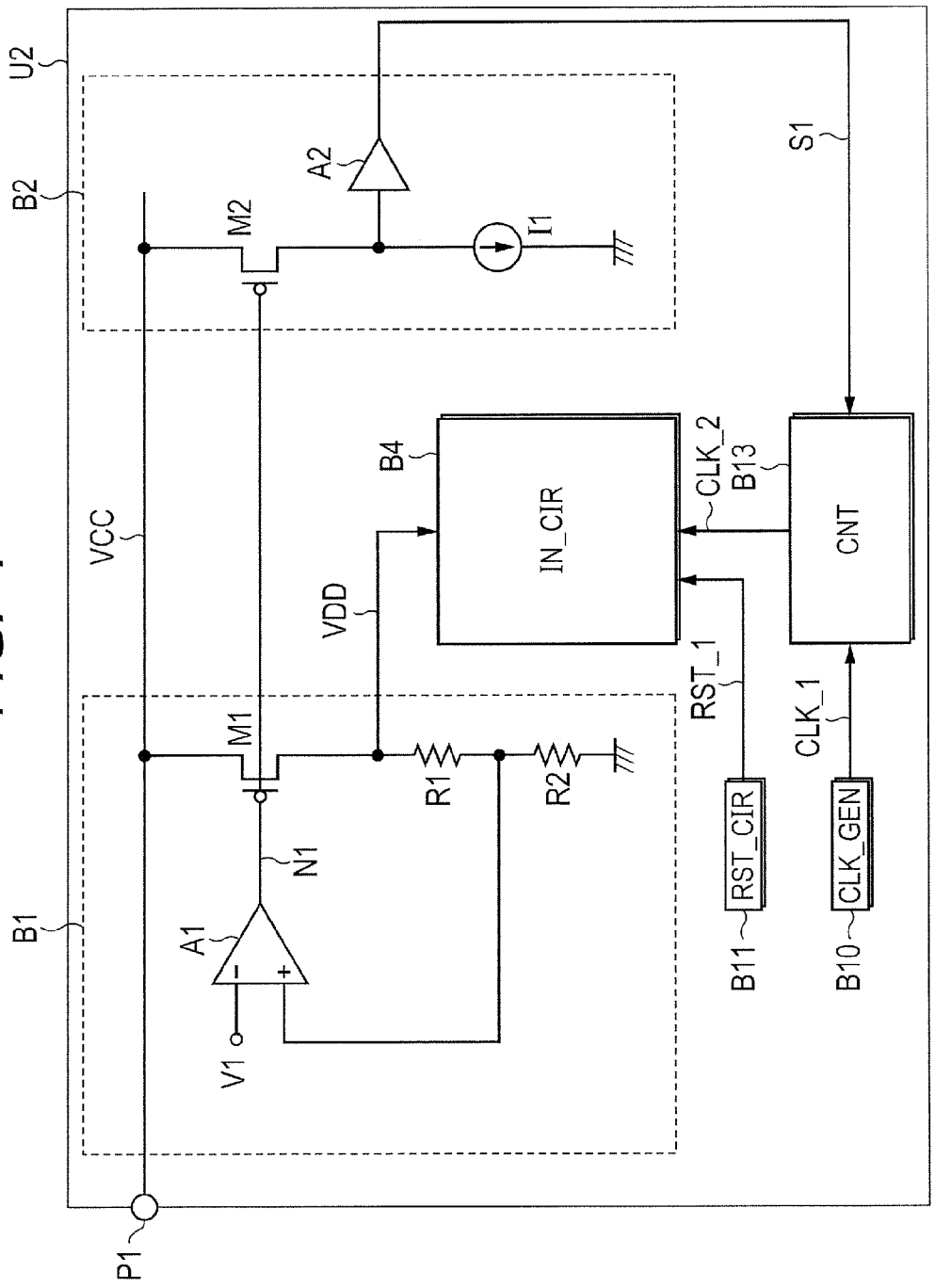
FIG. 7 is a block diagram illustrating the detailed internal configuration of the semiconductor device U2.

FIG. 7 is a block diagram illustrating the detailed internal configuration of the semiconductor device U2. For clarification, FIG. 7 shows the regulator circuit B1, the current detection circuit B2, the internal circuit B4, a control circuit B13, and the power supply terminal P1 in the semiconductor device U2. The control circuit B13 shown in FIG. 7 stops the supply of the operation clock signal CLK_2 to the internal circuit B4 when the current detection circuit B2 detects the abnormal current. The operating power supply voltage of the control circuit B13 may be the external power supply voltage VCC or the internal power supply voltage VDD.

Figure 8:
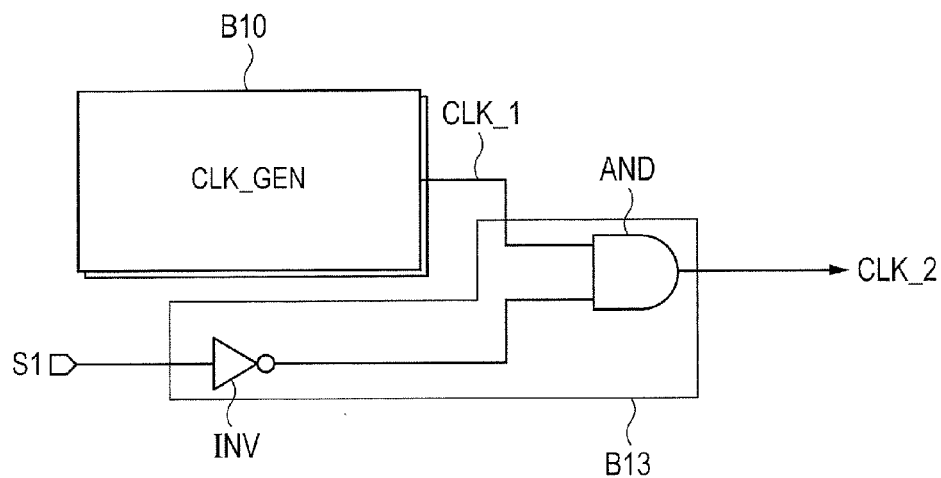
FIG. 8 is a block diagram illustrating the internal configuration of a control circuit B13.

FIG. 8 is a block diagram illustrating the internal configuration of the control circuit B13. As shown in FIG. 8, the control circuit B13 is configured with e.g. an AND circuit AND and an inverter circuit INV. The clock signal CLK_1 outputted from the clock generation unit B10 is supplied to one input terminal of the AND circuit AND, and the detection signal S1 is inputted through the inverter circuit INV to the other input terminal of the AND circuit AND. The output signal of the AND circuit AND is supplied as the operation clock signal CLK_2 to the internal circuit B4.

Figure 9:
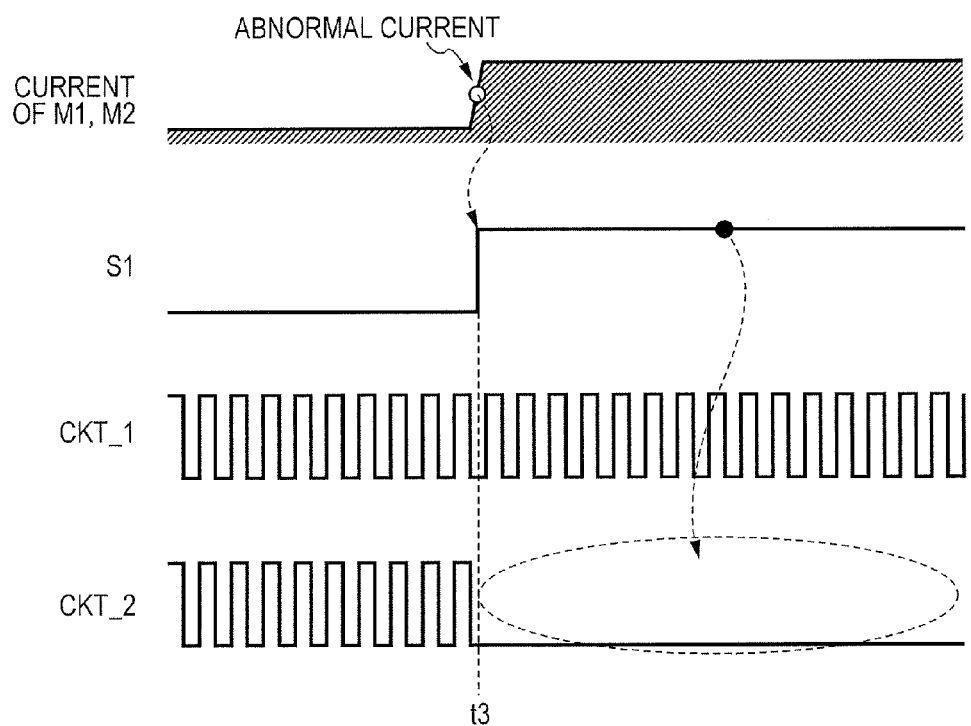
FIG. 9 is an explanation diagram showing an operation example of the control circuit B13 at the time of detection of the abnormal current.

FIG. 9 shows an operation example of the control circuit B13 at the time of detection of the abnormal current. As shown in FIG. 9, when the abnormal current flows through the PMOS transistor M1 at timing t3, the current detection circuit B2 detects it, and the control signal S1 becomes the high level. Thereby, the control circuit B13 turns the operation clock signal CLK_2 to the low level. Thus, if the control signal S1 is at the low level ("0"), the operation clock signal CLK_2 is supplied to the internal circuit B4, and if the control signal S1 is at the high level ("1"), the operation clock signal CLK_2 is fixed to the low level.

Thus, according to the semiconductor device of the second embodiment, when the abnormal current flows through the internal circuit, it is possible to stop the operation clock signal and cause the internal circuit to transition to a stopped state; therefore, it is possible to easily prevent the malfunction of the internal circuit.

Third Embodiment

Figure 10:
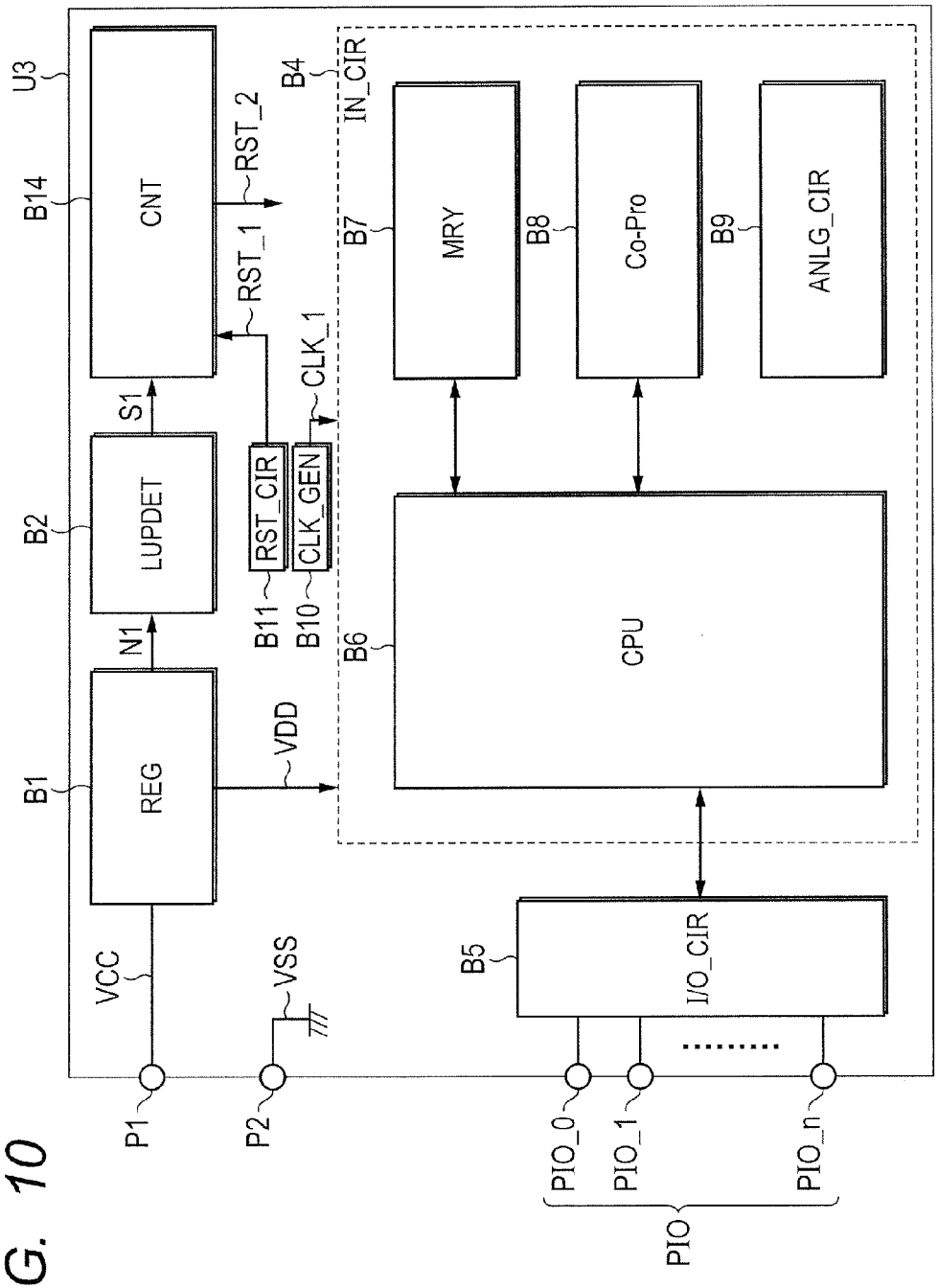
FIG. 10 is a block diagram illustrating the basic configuration of a semiconductor device for the contact IC card, according to a third embodiment.

FIG. 10 is a block diagram illustrating the basic configuration of a semiconductor device for the contact IC card, according to the third embodiment. The semiconductor device U3 shown in FIG. 10 resets the internal circuit B4 upon detection of the abnormal current in the internal circuit B4. In FIG. 10, the same components as those of the semiconductor devices U1 and U2 are denoted by the same reference numerals, and detailed description thereof is omitted.

Figure 11:
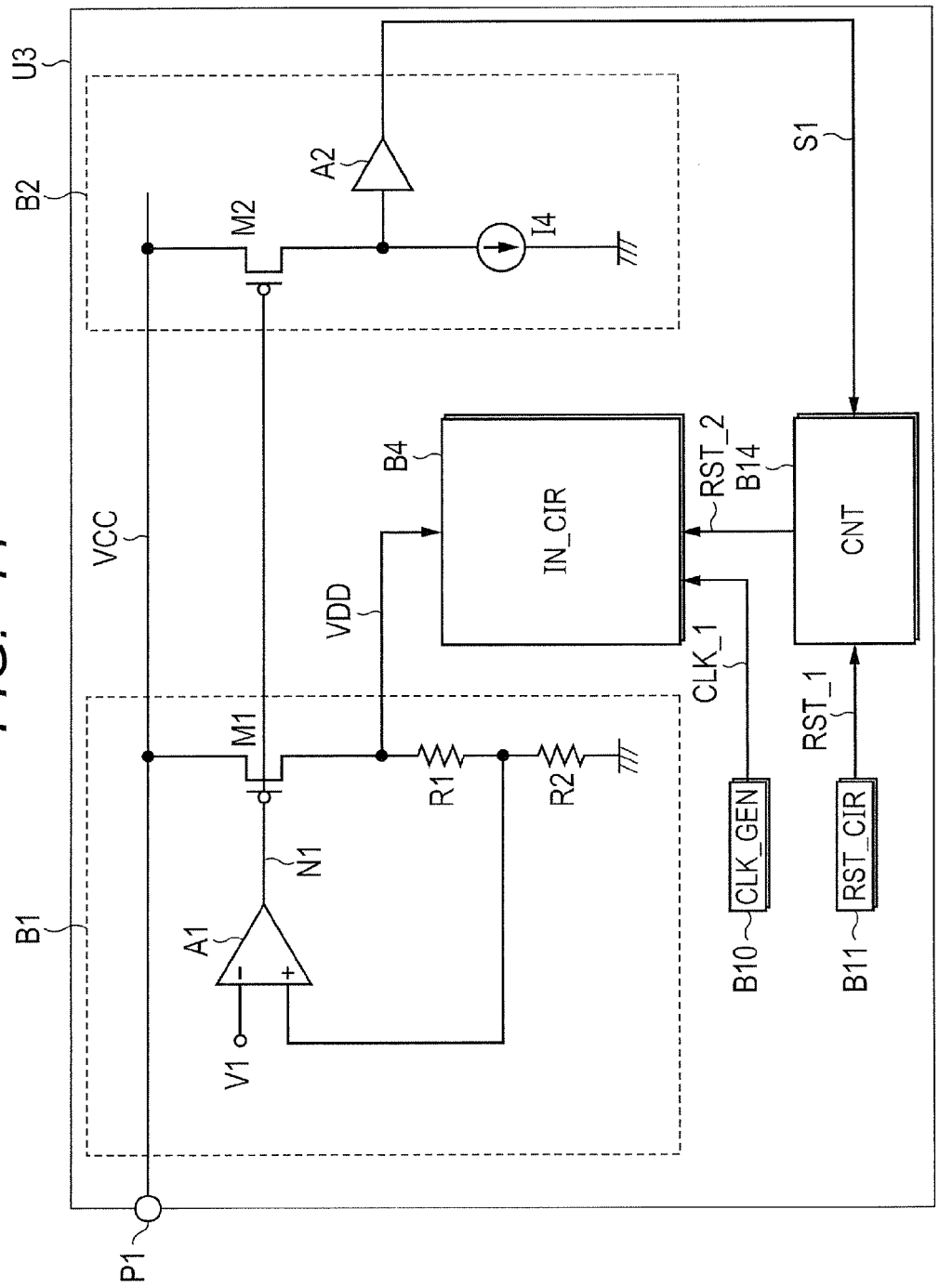
FIG. 11 is a block diagram illustrating the detailed internal configuration of the semiconductor device U3.

FIG. 11 is a block diagram illustrating the detailed internal configuration of the semiconductor device U3. For clarification, FIG. 11 shows the regulator circuit B1, the current detection circuit B2, the internal circuit B4, a control circuit B14, and the power supply terminal P1 in the semiconductor device U3. The control circuit B14 shown in FIG. 11 resets the internal circuit B4 when the current detection circuit B2 detects the abnormal current. The operating power supply voltage of the control circuit B14 may be the external power supply voltage VCC or the internal power supply voltage VDD.

Figure 12:
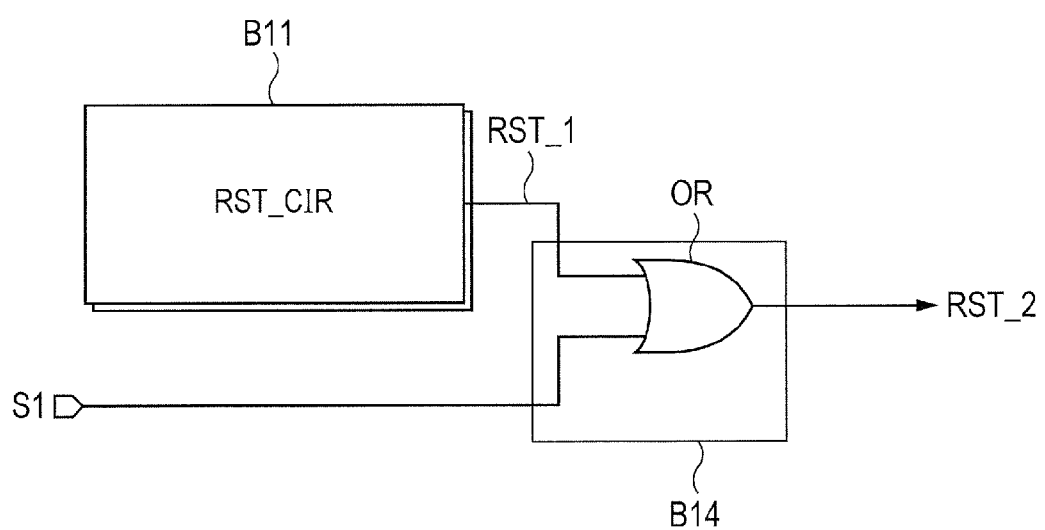
FIG. 12 is a block diagram illustrating the internal configuration of a control circuit B14.

FIG. 12 shows an example of the internal configuration of the control circuit B14. As shown in FIG. 12, the control circuit B14 is configured with e.g. an OR circuit OR. The reset signal RST_1 outputted from the reset circuit B11 is supplied to one input terminal of the OR circuit OR, and the detection signal S1 is inputted to the other input terminal. The output signal of the OR circuit OR is supplied as a reset signal RST_2 to the internal circuit B4.

Figure 13:
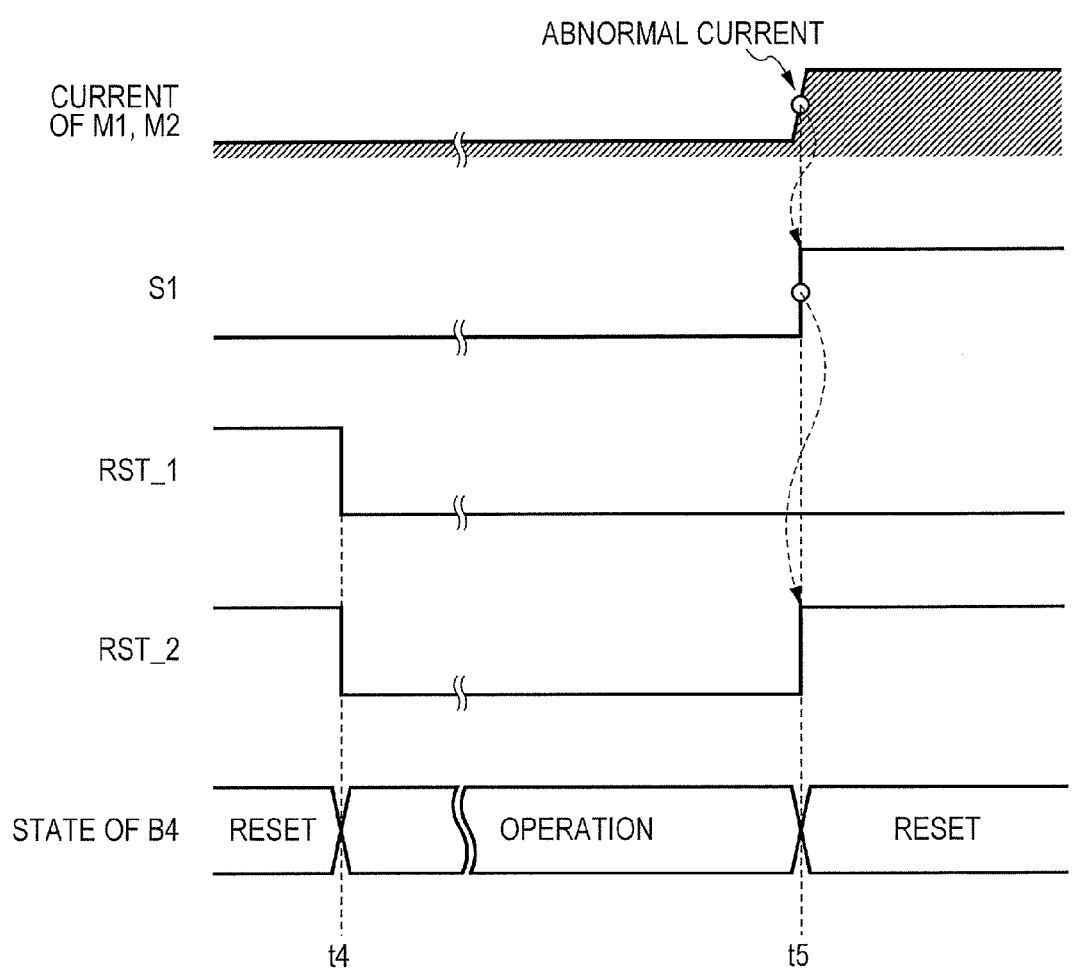
FIG. 13 is an explanation diagram showing an operation example of the control circuit B14 at the time of detection of the abnormal current.

FIG. 13 shows an operation example of the control circuit B14 at the time of detection of the abnormal current. As shown in FIG. 13, when the reset signal RST_1 is canceled in a state where the detection signal S1 is at the low level, at timing t4 the reset signal RST_2 becomes the low level which cancels the reset state of the internal circuit B4, so that the internal circuit B4 starts an operation. Then, when the abnormal current flows through the PMOS transistor M1 at timing t5, the current detection circuit B2 detects it, and the control signal S1 becomes the high level. Thereby, the control circuit B14 turns the reset signal RST_2 to the high level. Thus, if the control signal S1 is at the high level "1", the reset signal RST_2 can be fixed to the high level, which causes the internal circuit B4 to transition to the reset state.

Thus, according to the semiconductor device of the third embodiment, when the abnormal current flows through the internal circuit, it is possible to cause the internal circuit to transition to the reset state; therefore, it is possible to easily prevent the malfunction of the internal circuit.

Fourth Embodiment

Figure 14:
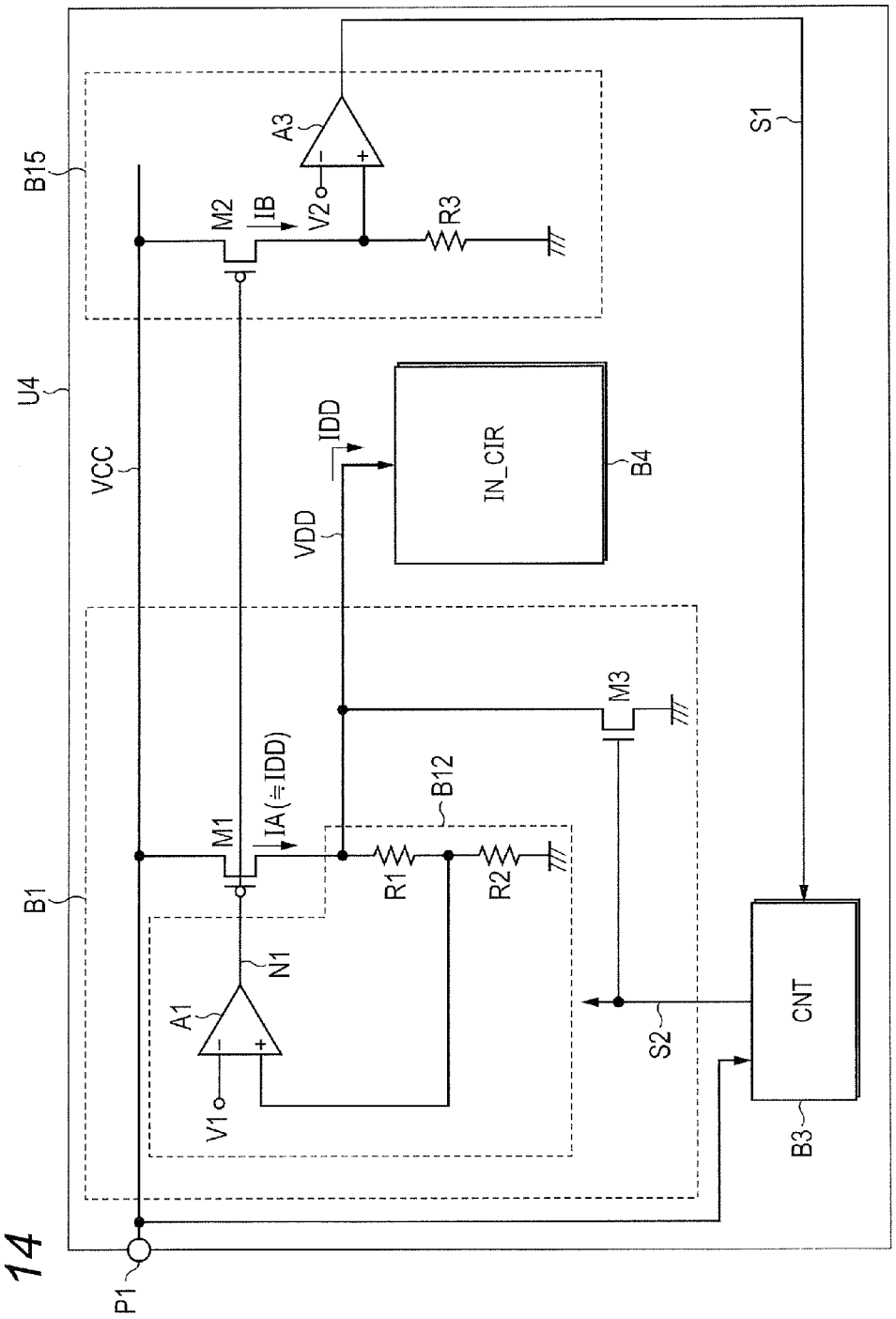
FIG. 14 is a block diagram illustrating the detailed internal configuration of a semiconductor device U4.

FIG. 14 is a block diagram illustrating the detailed internal configuration of a semiconductor device according to the fourth embodiment. The semiconductor device U4 shown in FIG. 14 includes a current detection circuit B15 in place of the current detection circuit B2 of the semiconductor device U1 according to the first embodiment. The other circuit configuration is the same as that of the semiconductor device U1, and the same components are denoted by the same reference numerals, and detailed description thereof is omitted.

As shown in FIG. 14, the current detection circuit B15 includes the PMOS transistor M2, a resistor R3, and a comparator circuit A3. The PMOS transistor M2 is the same as that of the current detection circuit B2, and is configured as in FIG. 4.

The resistor R3 is provided between the drain terminal of the PMOS transistor M2 and the ground terminal VSS, and converts the drain current IB of the PMOS transistor M2 into a voltage "R3×IB". The comparator circuit A3 compares the detection voltage "R3×IB" converted by the resistor R3 with a reference voltage V2 for determining whether or not the abnormal current flows through the internal circuit B4, and outputs a comparison result as the detection signal S1. For example, the comparator circuit A3 outputs the signal of the high level (VCC) if the detection voltage "R3×IB" is larger than the reference voltage V2, and outputs the signal of the low level (VSS) if the detection voltage "R3×IB" is smaller than the reference voltage V2.

A current detection level which is a threshold value for determining whether or not the abnormal current flows is determined based on the element size ratio between the PMOS transistors M1 and M2, the reference voltage V2, and the resistor R3. For example, in the case where the size ratio (W/L) of the PMOS transistor M2 is 1/N that of the PMOS transistor M1, when the drain current IA of the PMOS transistor M1 becomes N times larger than a detection current V2/R3, the signal level of the detection signal S1 switches to the high level. That is, the current detection level is "N×V2/R3". The current detection level "N×V2/R3" is set to be larger than the consumption current of the internal circuit B4 during the normal operation. This makes it possible to determine that the abnormal current larger than the consumption current during the normal operation flows through the internal circuit B4 when the detection signal S1 from the current detection circuit B15 becomes the high level.

Thus, according to the semiconductor device of the fourth embodiment, as in the first embodiment, it is possible to detect the occurrence of an abnormality such as latchup in the internal circuit B4 and prevent the malfunction of the internal circuit. Further, by configuring the current detection circuit B15 with the resistor R3 and the comparator circuit A3, it is possible to improve the detection accuracy of the abnormal current.

Fifth Embodiment

Figure 15:
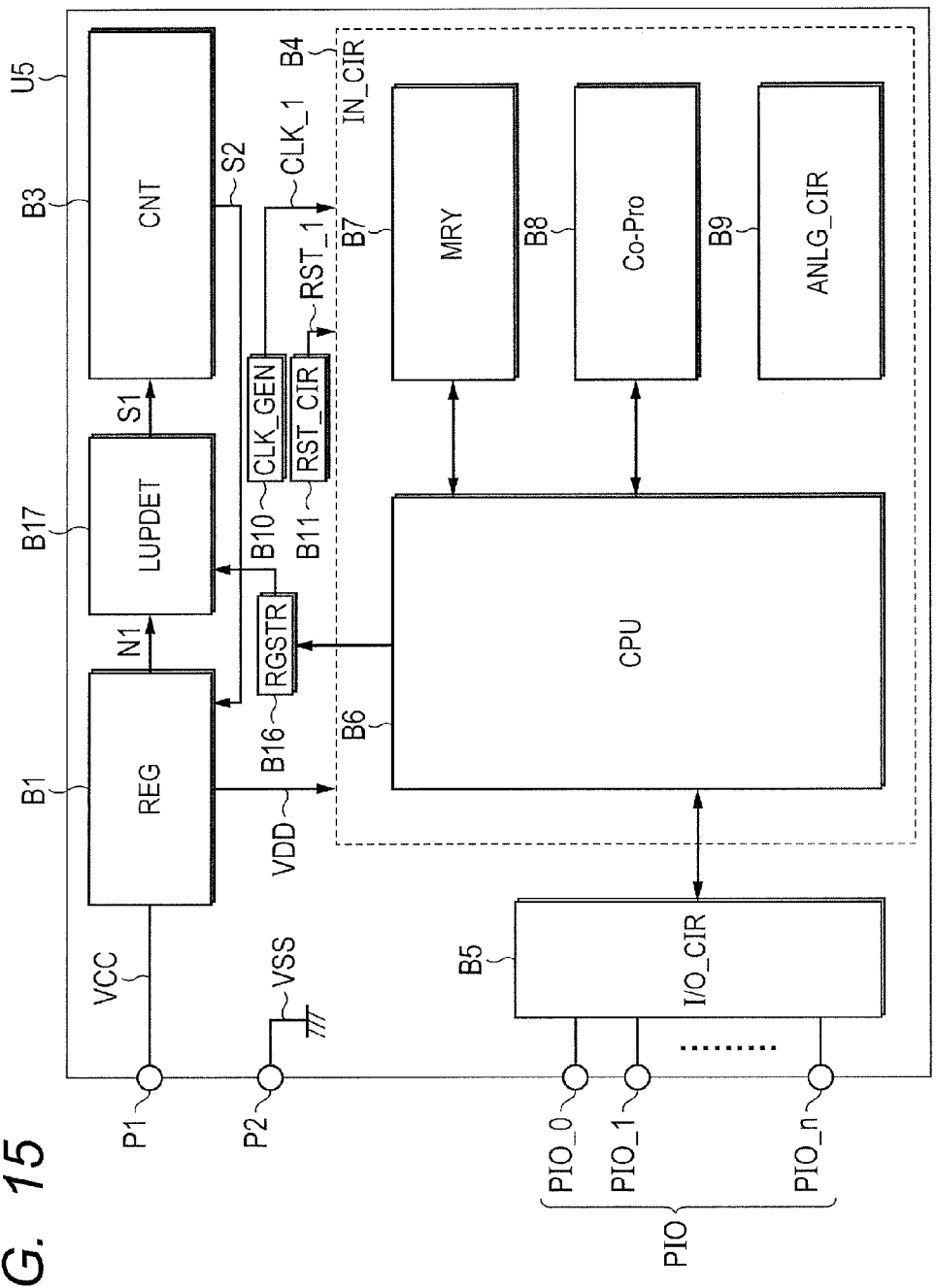
FIG. 15 is a block diagram illustrating the basic configuration of a semiconductor device for the contact IC card, according to a fifth embodiment.

FIG. 15 is a block diagram illustrating the basic configuration of a semiconductor device for the contact IC card, according to the fifth embodiment. The semiconductor device U5 shown in FIG. 15 has the function of switching the current detection level of the current detection circuit in addition to the function of the semiconductor device U1 according to the first embodiment. More specifically, the semiconductor device U5 further has a register circuit B16. In FIG. 15, the same components as those of the semiconductor device U1 are denoted by the same reference numerals, and detailed description thereof is omitted.

Figure 16:
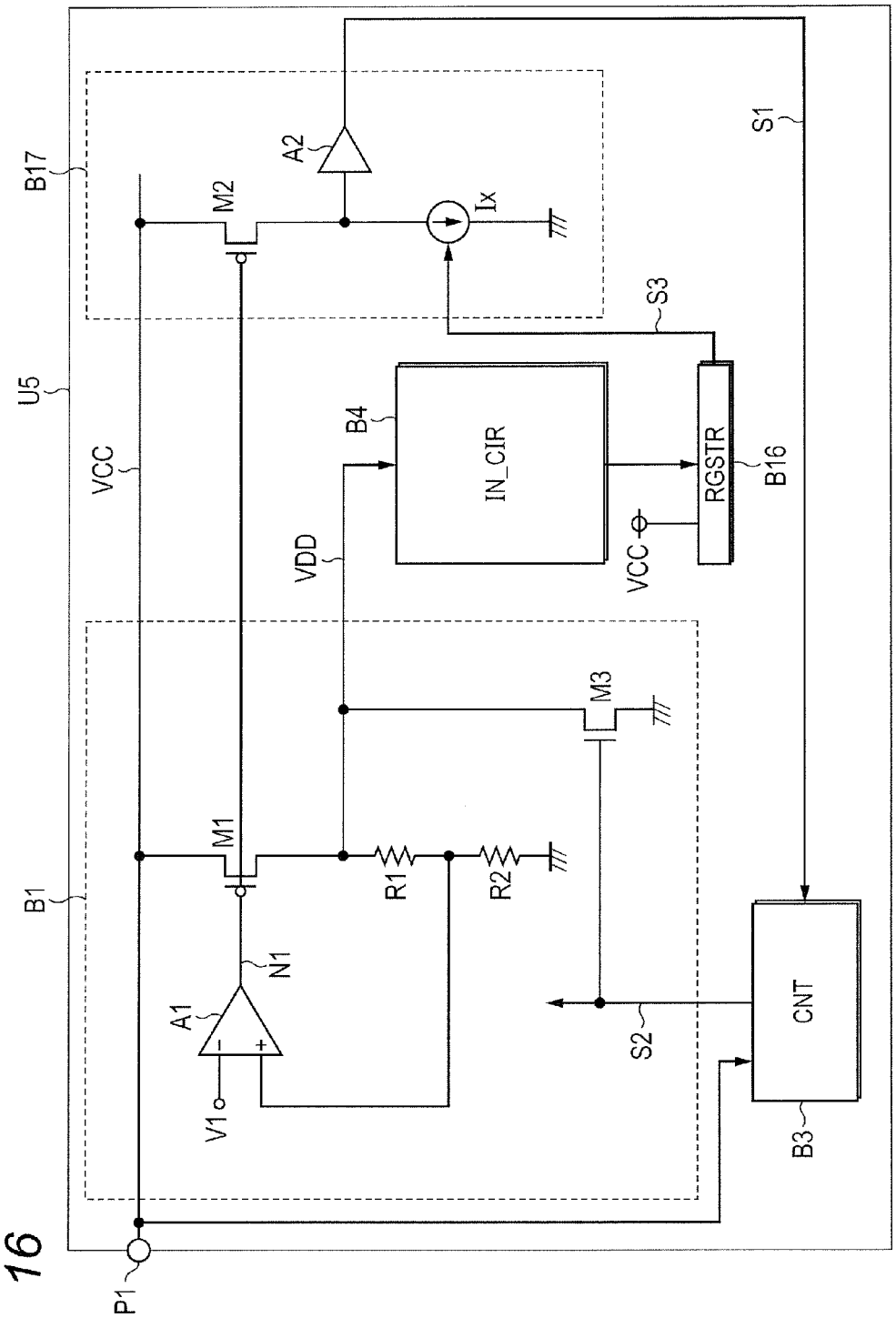
FIG. 16 is a block diagram illustrating the detailed internal configuration of the semiconductor device U5.

FIG. 16 is a block diagram illustrating the detailed internal configuration of the semiconductor device U5. For clarification, FIG. 16 shows the regulator circuit B1, a current detection circuit B17, the internal circuit B4, the register circuit B16, the control circuit B3, and the power supply terminal P1 in the semiconductor device U5.

The register circuit B16 has a storage area which stores information for determining the current detection level and which can be accessed by the central processing unit B6. A value set in the register circuit B16 is outputted as a control signal S3. The information for determining the current detection level is, for example, a value indicating a consumption current according to the operation mode of the internal circuit B4. Although the details will be described later, the value set in the register circuit B16 is updated by the central processing unit B6 in accordance with the switching of the operation mode of the internal circuit B4.

The current detection circuit B17 has a variable current source Ix in place of the current source I1 of the current detection circuit B2. The reference current value Ix of the variable current source Ix is controlled in accordance with the control signal S3 outputted from the register circuit B16.

That is, the current detection level by the current detection circuit B17 is controlled by the control signal S3.

Figure 17:
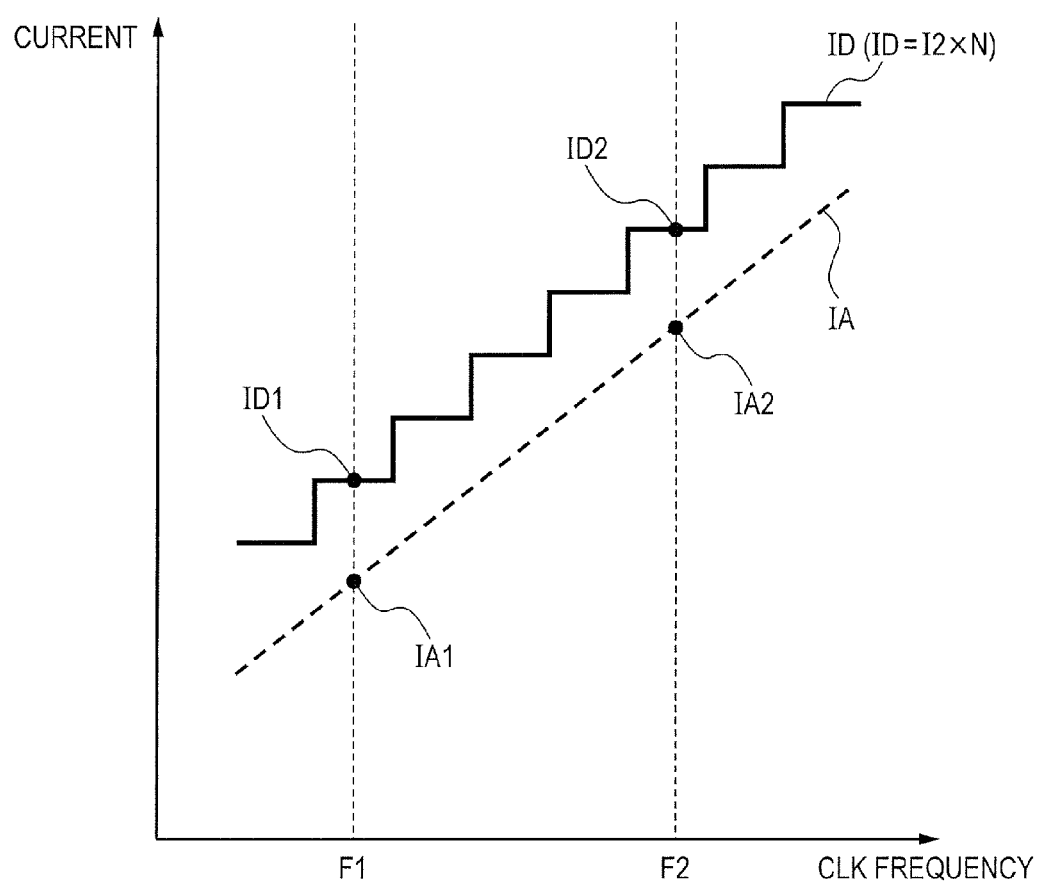
FIG. 17 is a graph illustrating the relationship between a current IA flowing through the PMOS transistor M1 and a current detection level ID of a current detection circuit B17.

FIG. 17 is an explanation diagram illustrating the relationship between the current IA flowing through the PMOS transistor M1 and the current detection level ID of the current detection circuit B17. In FIG. 17, the horizontal axis represents the operation clock frequency of the internal circuit B4, and the vertical axis represents the consumption current of the internal circuit B4.

The consumption current of the internal circuit B4 is proportional to the operation clock frequency of the internal circuit B4. Therefore, as shown in FIG. 17, the current IA flowing through the PMOS transistor M1 is proportional to the operation clock frequency. Accordingly, for example, the current detection level ID of the current detection circuit B17 is set to ID1 at an operation clock frequency "F1", and set to ID2 at an operation clock frequency "F2". More specifically, if the internal circuit B4 operates in a first operation mode at the operation clock frequency "F1", the central processing unit B6 sets, in the register circuit B16, a value indicating a consumption current (IA1) of the internal circuit B4 in the first operation mode. This generates the reference current Ix corresponding to the current detection level "ID1" according to the first operation mode. Further, at the time of switching to a second operation mode at the operation clock frequency "F2", the central processing unit B6 sets, in the register circuit B16, a value indicating a consumption current (IA2) of the internal circuit B4 in the second operation mode. This generates the reference current Ix corresponding to the current detection level "ID2" according to the second operation mode.

In addition, since the consumption current of the internal circuit B4 varies depending on the presence or absence of execution of data processing by the coprocessor B8, it is also effective to change the set value of the register circuit B16 in response to switching to an operation mode in which the coprocessor B8 executes data processing. For example, in an operation mode in which the coprocessor B8 does not perform a cryptographic arithmetic operation, a value corresponding to a low current detection level is set in the register circuit B16. In an operation mode in which the coprocessor B8 performs a cryptographic arithmetic operation, a value corresponding to a high current detection level is set in the register circuit B16.

Thus, according to the semiconductor device of the fifth embodiment, as in the first embodiment, it is possible to detect the occurrence of an abnormality such as latchup in the internal circuit and prevent the malfunction of the internal circuit. Further, the register circuit B16 facilitates the adjustment of the current detection level. For example, by adjusting the current detection level in accordance with the operation mode of the internal circuit B4 as described above, it is possible to maintain the small difference between the current IA flowing through the PMOS transistor M1 and the current detection level ID regardless of the consumption current change of the internal circuit B4 according to the operation mode and suppress variation in the detection sensitivity of the abnormal current.

Sixth Embodiment

Figure 18:
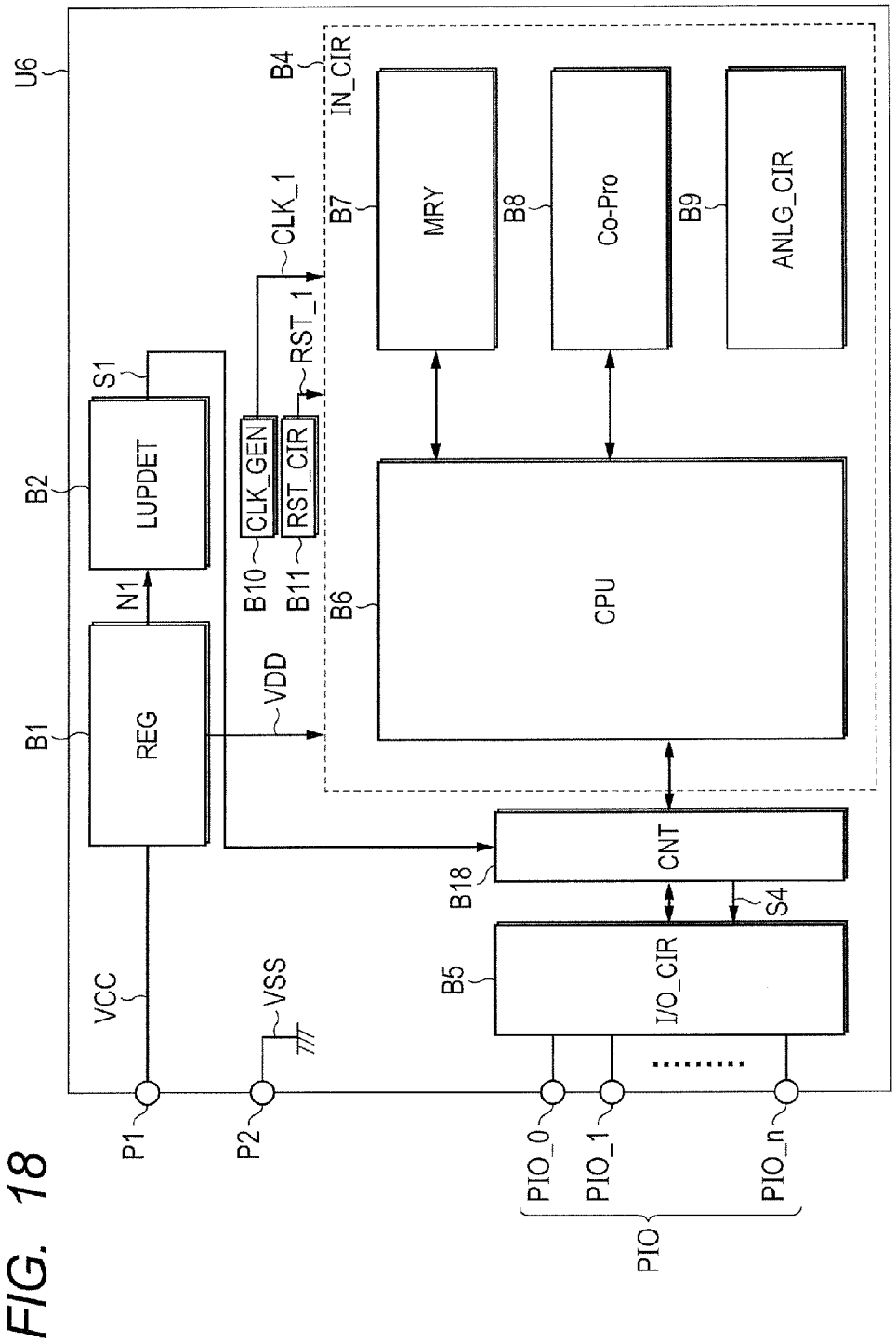
FIG. 18 is a block diagram illustrating the basic configuration of a semiconductor device for the contact IC card, according to a sixth embodiment.

FIG. 18 is a block diagram illustrating the basic configuration of a semiconductor device for the contact IC card, according to the sixth embodiment. The semiconductor device U6 shown in FIG. 18 stops communication between the internal circuit B4 and an external device upon detection of the abnormal current in the internal circuit B4. In FIG. 18, the same components as those of the semiconductor device U1 are denoted by the same reference numerals, and detailed description thereof is omitted.

Figure 19:
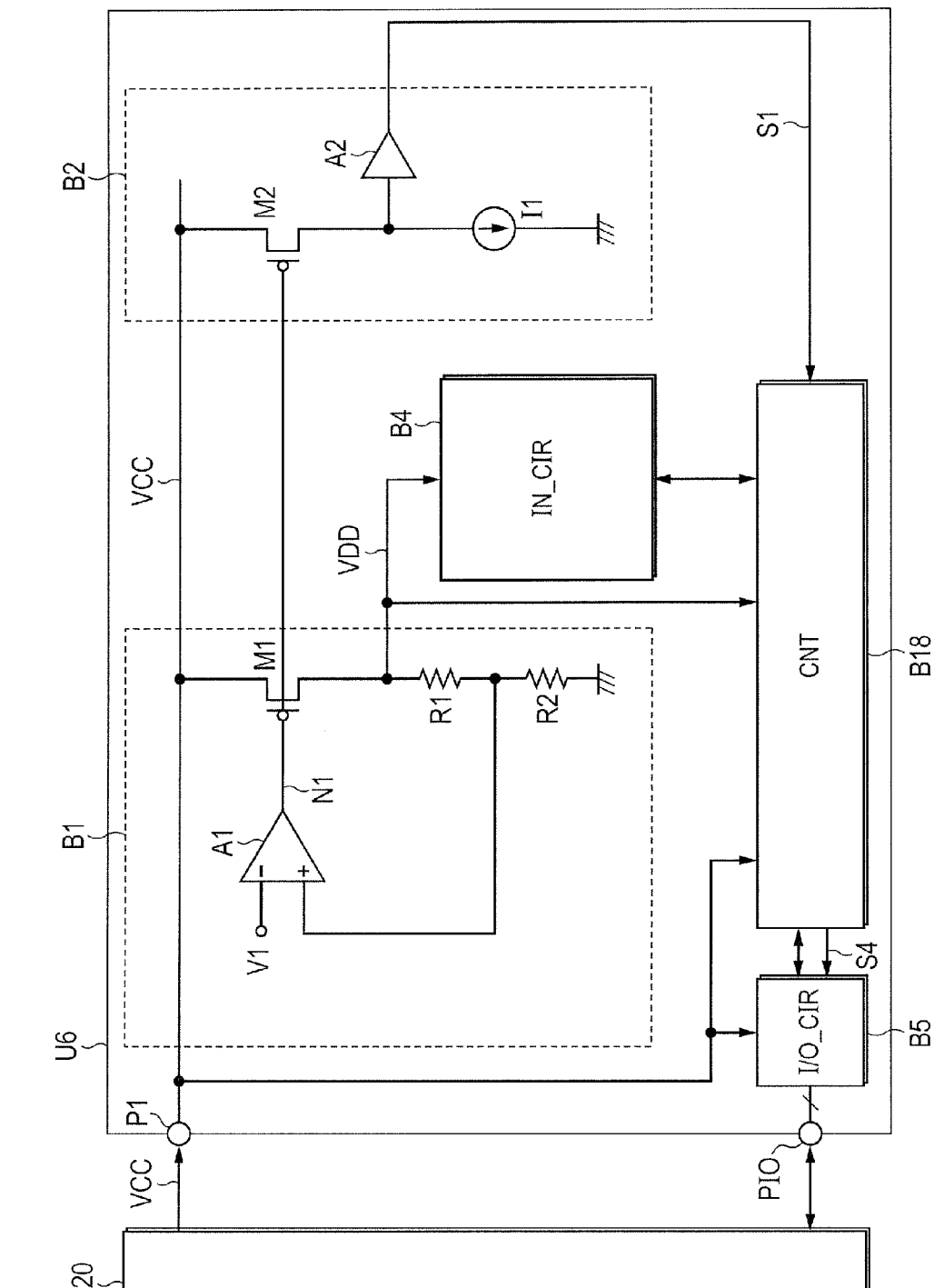
FIG. 19 is a block diagram illustrating the detailed internal configuration of the semiconductor device U6.

FIG. 19 is a block diagram illustrating the detailed internal configuration of the semiconductor device U6. For clarification, FIG. 19 shows the power supply terminal P1, the signal input/output terminal PIO, the regulator circuit B1, the current detection circuit B2, the internal circuit B4, a control circuit B18, the I/O circuit B5, and an external control device U20. The external control device U20 controls the supply of the power supply voltage VCC to the semiconductor device U6, transmits and receives signals to/from the internal circuit B4 of the semiconductor device U6, and is provided outside the semiconductor device U6.

Through the I/O circuit B5 and the control circuit B18, the communication between the internal circuit B4 and the external control device U20 is performed. The control circuit B18 controls whether or not to permit communication between the internal circuit B4 and the external control device U20 in accordance with the detection signal S1 outputted from the current detection circuit B2. More specifically, if the detection signal S1 does not indicate the detection of the abnormal current (the detection signal S1 is at the low level), the control circuit B18 permits data transmission/reception between the internal circuit B4 and the external control device U20. In this case, the control circuit B18 functions as only a buffer, and the internal circuit B4 can transmit and receive data to/from the external control device through the I/O circuit B5 and the control circuit B18. More specifically, the control circuit B18 converts the signal level of a data signal inputted from the outside through the signal input/output terminal PIO from the external power supply voltage VCC to the internal power supply voltage VDD, and outputs it to the internal circuit B4. Further, the control circuit B18 converts the signal level of a data signal inputted from the internal circuit B4 from the internal power supply voltage VDD to the external power supply voltage VCC, and outputs it through the I/O circuit B5 to the signal input/output terminal PIO. On the other hand, if the detection signal S1 indicates the detection of the abnormal current (the detection signal S1 is at the high level), the control circuit B18 shuts off the data transmission/reception between the internal circuit B4 and the external control device U20, and outputs an error signal S4 for notifying the occurrence of the abnormal current through the I/O circuit B5 to the signal input/output terminal PIO. According to this, when the abnormal current flows through the internal circuit B4, it is possible to stop the communication between the internal circuit B4 and the external control device U20; therefore, it is possible to prevent the fraudulent acquisition and falsification of data in an abnormal state.

Further, when the external control device U20 receives the error signal S4 from the signal input/output terminal PIO, the external control device U20 stops the supply of the power supply voltage VCC to the semiconductor device U6. This makes it possible to avoid the state where the abnormal current continues to flow through the semiconductor device U6; therefore, it is possible to prevent the malfunction of the internal circuit B4 and cause the whole system to transition to a safer state, compared to stopping the power supply to only the internal circuit B4. Further, since the external control device U20 performs control so as to stop the power supply to the semiconductor device U6 and resume the power supply after the lapse of the predetermined time, it is possible to facilitate power management system design.

Seventh Embodiment

Figure 20:
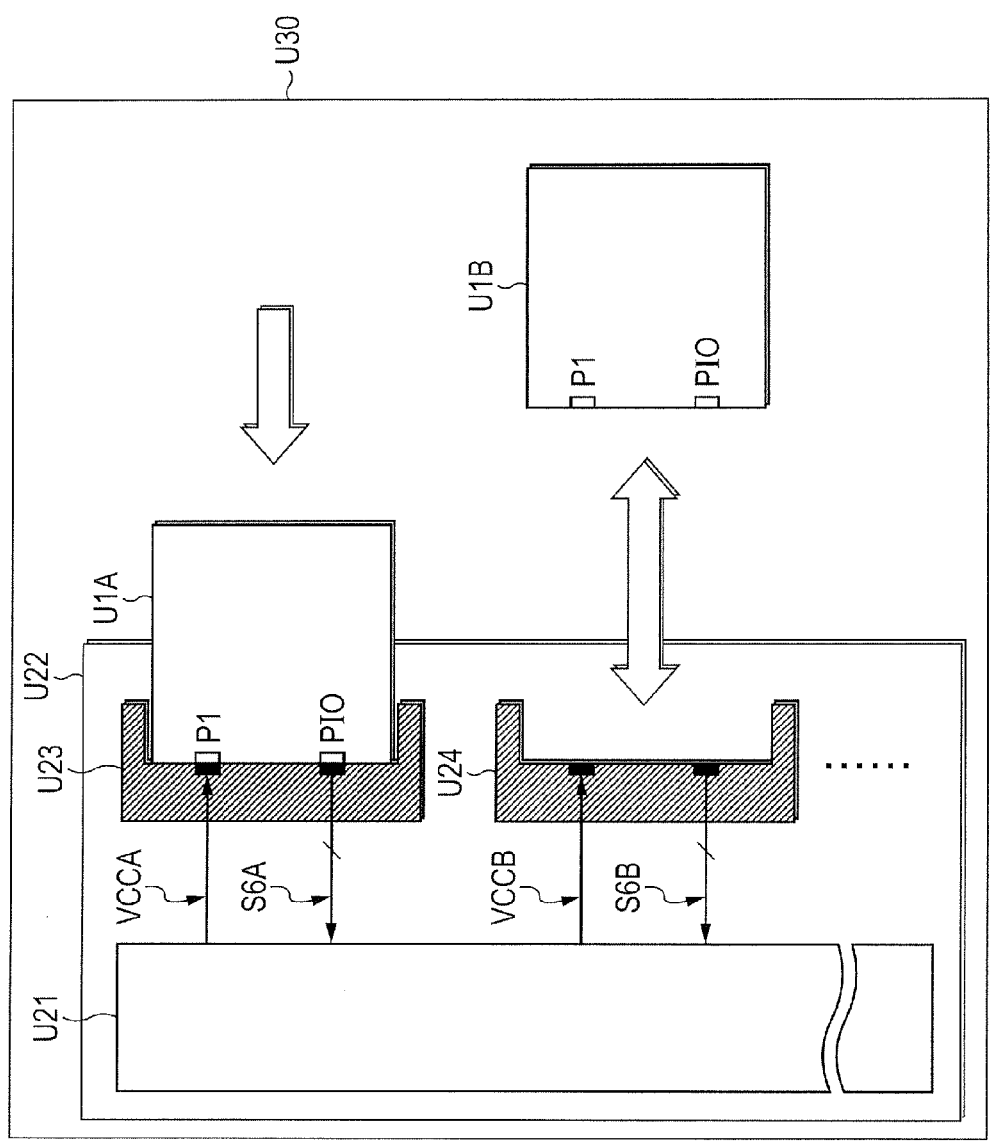
FIG. 20 is a block diagram illustrating a control system incorporating semiconductor devices having the function of detecting the abnormal current.

FIG. 20 is a block diagram illustrating a control system incorporating semiconductor devices having the function of detecting the abnormal current. The control system U30 shown in FIG. 20 is, for example, an automotive control system for car engine control. In FIG. 20, a semiconductor device U1A and a plurality of semiconductor devices U1B are microcontrollers having the function of detecting the abnormal state of the internal circuit B4, like the above-described semiconductor devices U1 to U6. The following description will be made by way of example in which the semiconductor devices U1A and U1B are the semiconductor device U6 having the function of notifying the detection of the abnormal current to the outside.

In FIG. 20, the control system U30 includes a control device U21 and sockets U23 and 24 disposed on a module board U22. The semiconductor device U1A is mounted in the socket U23. Further, the semiconductor devices U1B are mounted in the respective sockets U24. In FIG. 20, a pair of the semiconductor device U1B and the socket U24 is illustrated for convenience of explanation. The semiconductor devices U1A and U1B are detachably coupled to the sockets U23 and 24, and electrically coupled to the control device U21 through the sockets U23 and 24 and the module board U22.

The control device U21 controls the supply of power supply voltages VCCA and VCCB to the semiconductor devices U1A and U1B, and transmits and receives signals to/from the internal circuits B4 of the semiconductor devices U1A and U1B. Further, the control device U21 operates the semiconductor device U1A as a main terminal and operates the semiconductor device U1B as a backup (sub-terminal) of the semiconductor device U1A, and transmits and receives data to/from each terminal. The number of semiconductor devices U1B as the backup is not limited, and may be e.g. one.

The control device U21 has the function of switching to and using the semiconductor device U1B as the main terminal upon the occurrence of an abnormality in the semiconductor device U1A. For example, when the control device U21 boots up, the control device U21 starts the supply of the power supply voltage VCCA to the semiconductor device U1A, and transmits and receives a data signal S6A to/from the semiconductor device U1A through the I/O circuit provided therein. Along with this, the control device U21 also starts the supply of the power supply voltage VCCB to the semiconductor device U1B, and transmits and receives a data signal S6B to/from the semiconductor device U1B to start the backup of the semiconductor device U1A. Then, upon the occurrence of the abnormal current in the internal circuit B4 configuring the semiconductor device U1A, the semiconductor device U1A transmits the data signal S6A as an error signal indicating the abnormal state to the control device U21, and the control device U21 detects the abnormality of the semiconductor device U1A and switches to the semiconductor device U1B as the main terminal. In this case, if there is no failure in the semiconductor device U1A in which the abnormality has occurred, the control device U21 may operate the semiconductor device U1A again by suspending the supply of the power supply voltage VCCA and rebooting the semiconductor device U1A. It is also possible to use the rebooted semiconductor device U1A as the backup of the semiconductor device U1B.

Thus, according to the control system of the seventh embodiment, when the abnormal current flows through the internal circuit of the semiconductor device U1A for example, the control device U21 stops the power supply not only to the internal circuit but to the whole of the semiconductor device U1A; therefore, it is possible to avoid the state where the abnormal current continues to flow through the semiconductor device and cause the whole system to transition to a safer state. Further, it is possible to continue processing without stopping the system when the semiconductor device U1A as the main terminal falls into the abnormal state, thus enabling a more stable system. Further, by detachably coupling the semiconductor devices U1A and U1B to the sockets U23 and 24, it becomes easy to discontinue the use of the semiconductor device through which the abnormal current has once flowed and replace it with another semiconductor device, which is particularly effective in terms of maintaining the system in the safe state.

While the invention made above by the present inventors has been described specifically based on the illustrated embodiments, the present invention is not limited thereto. It is needless to say that various changes and modifications can be made thereto without departing from the spirit and scope of the invention.

For example, it is possible to use the current detection circuit B15 in place of the current detection circuit B2 in the semiconductor devices U1 to U3, U5, and U6. For example, in the case where the current detection circuit B15 is applied to the semiconductor device U5, by varying the resistance value of the resistor R3 in accordance with the set value of the register circuit B16, it becomes possible to adjust the current detection level, as in the fifth embodiment.

It is also possible to incorporate the control circuit B13 according to the second embodiment and the control circuit B14 according to the third embodiment in the semiconductor devices U2, U3. This makes it possible to stop the supply of the operation clock signal and also reset the internal circuit upon detection of the abnormal current, which can stop the internal circuit more safely.

It is also possible to add the function of notifying the detection of the abnormal current to the outside to the semiconductor devices U1 to U5 as well as the semiconductor device U6.

Further, it is also possible to write the detection of the abnormal current to a separately prepared storage device.

For example, upon detection of the abnormal current in the internal circuit in the semiconductor device U1, the control circuit B3 stops the operation of the regulator circuit B1 and writes "1" to a latch circuit operating at the power supply voltage VCC. Then, after the internal circuit B4 is rebooted, the central processing unit B6 refers to the latch circuit and thereby can know that the internal circuit B4 has fallen into the abnormal state.

While the first to seventh embodiments illustrate the case where the semiconductor devices U1 to U6 are applied to the secure microcontroller incorporated in the contact IC card, the semiconductor devices can be applied not only thereto but also to a secure microcontroller incorporated in a dual-way IC card having both the functions of the contact IC card and a contactless IC card. In this case, it is particularly effective to add the abnormal current detection function according to the embodiments to the regulator circuit for generating the internal power supply voltage from the power supply voltage supplied to the contact terminal. In addition, the semiconductor devices can be applied to an automotive microcontroller and an authentication secure microcontroller.

The circuit for detecting the abnormal current in the internal circuit is not limited to the circuit configurations of the current detection circuits B2, B15, and B17, and may be any other circuit configuration that can detect the power supply current of the internal circuit B4.

What is claimed is:

1. A semiconductor device comprising:
    a regulator unit for generating an internal power supply voltage based on a power supply voltage supplied from outside the semiconductor device;
    an internal circuit which operates on the internal power supply voltage;
    a current detection unit for monitoring a power supply current supplied to the internal circuit; and
    a control unit for controlling operation of the internal circuit,
    wherein the internal circuit comprises a data processing unit for executing a program,
    wherein when the current detection unit detects that the power supply current exceeds a predetermined threshold value, the current detection unit outputs a detection result indicating that,
    wherein the control unit restricts the operation of the internal circuit in accordance with the detection result,
    wherein the regulator unit comprises
        a first MOS transistor for supplying the internal power supply voltage to the internal circuit; and
        an amplifier unit for adjusting a gate voltage of the first MOS transistor so that the internal power supply voltage is maintained constant, and
    wherein the current detection unit comprises
        a second MOS transistor whose gate voltage is equal to the gate voltage of the first MOS transistor; and
        a determination unit for determining whether or not the power supply current exceeds the predetermined threshold value, based on a current flowing through the second MOS transistor,
    wherein the semiconductor device futher comprises a register unit which can be accessed by the data processing unit and in which control information is set, and
    wherein the determination unit changes the predetermined threshold value in accordance with the control information set in the register unit.

2. The semiconductor device according to claim 1, wherein the control unit restricts the operation of the internal circuit by stopping power supply to the internal circuit.

3. The semiconductor device according to claim 2, wherein the control unit stops the power supply to the internal circuit by stopping operation of the regulator unit for a predetermined time.

4. The semiconductor device according to claim 1, wherein the data processing unit changes the control information in accordance with an operation clock frequency of the internal circuit.

5. The semiconductor device according to claim 1,
    wherein the data processing unit comprises a central processing unit, a storage unit, and a signal processing unit for executing signal processing in accordance with an instruction from the central processing unit, and
    wherein the central processing unit changes the control information in accordance with presence or absence of execution of signal processing by the signal processing unit.

6. The semiconductor device according to claim 1, wherein the control unit restricts the operation of the internal circuit by stopping supply of an operation clock signal to the internal circuit.

7. The semiconductor device according to claim 1, wherein the control unit restricts the operation of the internal circuit by resetting the internal circuit.

8. The semiconductor device according to claim 1, further comprising a communication terminal for transmitting and receiving a signal,
    wherein the control unit outputs an error signal indicating occurrence of an abnormality to the communication terminal in accordance with the detection result.

9. The semiconductor device according to claim 8, wherein the control unit restricts the operation of the internal circuit by shutting off communication through the communication terminal by the internal circuit.

10. The semiconductor device according to claim 1, wherein the second MOS transistor has s smaller current capability than the first MOS transistor.

11. The semiconductor device according to claim 10,
    wherein the first MOS transistor and the second MOS transistor comprise unit MOS transistors having predetermined gate length and gate width, and
    wherein the number of unit MOS transistors configuring the second MOS transistor is smaller than the number of unit MOS transistors configuring the first MOS transistor.

12. The semiconductor device according to claim 11, wherein the unit MOS transistors configuring the first MOS transistor and the unit MOS transistors configuring the second MOS transistor are formed in the same element formation region so that drains and sources are arranged in the same direction with respect to gates of the respective unit MOS transistors.

13. The semiconductor device according to claim 12, wherein the unit MOS transistors configuring the second MOS transistor are arranged dispersedly in the element formation region.

14. The semiconductor device according to claim 1,
    wherein the determination unit comprises:
    a current source which is coupled to a drain of the second MOS transistor and generates a reference current corresponding to the predetermined threshold value; and
    a comparison circuit for comparing magnitudes of the current flowing through the second MOS transistor and the reference current, based on a voltage of a node between the current source and the second MOS transistor, and
    wherein the comparison circuit outputs the detection result when the current flowing through the second MOS transistor is larger than the reference current.

15. The semiconductor device according to claim 1,
    wherein the determination unit comprises:
    a resistive element for converting the current flowing through the second MOS transistor into a voltage; and
    a comparison circuit for comparing the voltage converted by the resistive element with a reference voltage corresponding to the predetermined threshold value, and
    wherein the comparison circuit outputs the detection result when the converted voltage is larger.

16. A control system comprising:
    the semiconductor device according to claim 8; and
    a control device which controls supply of a power supply voltage to the semiconductor device and transmits and receives a signal to/from the semiconductor device, wherein when the error signal is outputted, the control device stops power supply to the semiconductor device that has outputted the error signal.

17. The control system according to claim 16, comprising a plurality of the semiconductor devices,
wherein the semiconductor devices comprise a first semiconductor device which operates as a main terminal and one or a plurality of second semiconductor devices which operate as sub-terminals, and
wherein when the error signal is outputted from the first semiconductor device, the control device operates one of the second semiconductor devices as the main terminal.

18. The control system according to claim 17, further comprising sockets in which the semiconductor devices are mounted and electrically couple the semiconductor devices to the control device,
wherein the semiconductor devices are detachably coupled to the sockets.

* * * * *